US008969105B2

(12) United States Patent
Hoisington et al.

(10) Patent No.: US 8,969,105 B2
(45) Date of Patent: Mar. 3, 2015

(54) FORMING A DEVICE HAVING A CURVED PIEZOELECTRIC MEMBRANE

(75) Inventors: Paul A. Hoisington, Hanover, NH (US); Jeffrey Birkmeyer, San Jose, CA (US); Andreas Bibl, Los Altos, CA (US); Mats G. Ottosson, Saltsjo-Boo (SE); Gregory De Brabander, San Jose, CA (US); Zhenfang Chen, Sunnyvale, CA (US); Mark Nepomnishy, San Jose, CA (US); Shinya Sugimoto, San Jose, CA (US)

(73) Assignee: FUJIFILM Corporation, Tokyo (JP)

( * ) Notice: Subject to any disclaimer, the term of this patent is extended or adjusted under 35 U.S.C. 154(b) by 88 days.

(21) Appl. No.: 13/810,696

(22) PCT Filed: Jul. 22, 2011

(86) PCT No.: PCT/US2011/045057
§ 371 (c)(1),
(2), (4) Date: Apr. 4, 2013

(87) PCT Pub. No.: WO2012/018561
PCT Pub. Date: Feb. 9, 2012

(65) Prior Publication Data
US 2013/0210175 A1 Aug. 15, 2013

Related U.S. Application Data

(60) Provisional application No. 61/367,827, filed on Jul. 26, 2010.

(51) Int. Cl.
H01L 21/00 (2006.01)
H01L 41/22 (2013.01)
B41J 2/14 (2006.01)
(Continued)

(52) U.S. Cl.
CPC ............ *H01L 41/22* (2013.01); *B41J 2/14233* (2013.01); *B41J 2/161* (2013.01); *B41J 2/1628* (2013.01); *B41J 2/1629* (2013.01); *B41J 2/1631* (2013.01); *B41J 2/1632* (2013.01); *B41J 2/1642* (2013.01); *B41J 2/1646* (2013.01); *H01L 41/098* (2013.01);
(Continued)

(58) Field of Classification Search
None
See application file for complete search history.

(56) References Cited

U.S. PATENT DOCUMENTS 3,962,063 A 6/1976 Hingorany
4,588,998 A 5/1986 Yamamuro et al.
(Continued)

FOREIGN PATENT DOCUMENTS

EP 1 255 307 11/2002
JP 200-141643 5/2000

*Primary Examiner* — Charles Garber
*Assistant Examiner* — Abdulfattah Mustapha
(74) *Attorney, Agent, or Firm* — Fish & Richardson P.C.

(57) ABSTRACT

Processes for forming an actuator having a curved piezoelectric membrane are disclosed. The processes utilize a profile-transferring substrate having a curved surface surrounded by a planar surface to form the curved piezoelectric membrane. The piezoelectric material used for the piezoelectric actuator is deposited on at least the curved surface of the profile-transferring substrate before the profile-transferring substrate is removed from the underside of the curved piezoelectric membrane. The resulting curved piezoelectric membrane includes grain structures that are columnar and aligned, and all or substantially all of the columnar grains are locally perpendicular to the curved surface of the piezoelectric membrane.

20 Claims, 27 Drawing Sheets

(51) Int. Cl.
   *B41J 2/16*      (2006.01)
   *H01L 41/09*     (2006.01)
   *H01L 41/316*    (2013.01)
   *H01L 41/33*     (2013.01)

(52) U.S. Cl.
   CPC .............. *H01L 41/316* (2013.01); *H01L 41/33* (2013.01); *B41J 2002/14241* (2013.01)
   USPC .... 438/21; 438/5; 257/E21.009; 257/E21.011

(56)         References Cited

U.S. PATENT DOCUMENTS

| | | |
|---|---|---|
| 4,700,203 A | 10/1987 | Yamamuro et al. |
| 5,340,510 A | 8/1994 | Bowen |
| 5,598,050 A | 1/1997 | Bowen et al. |
| 5,684,519 A | 11/1997 | Matoba et al. |
| 5,691,960 A | 11/1997 | Gentilman et al. |
| 5,841,736 A | 11/1998 | Bowen et al. |
| 5,856,837 A | 1/1999 | Kitahara et al. |
| 5,940,947 A | 8/1999 | Takeuchi et al. |
| 5,950,291 A | 9/1999 | Gentilman et al. |
| 6,107,726 A | 8/2000 | Near et al. |
| 6,111,818 A | 8/2000 | Bowen et al. |
| 6,217,150 B1 | 4/2001 | Heydinger |
| 6,217,158 B1 | 4/2001 | Kanaya et al. |
| 6,361,154 B1 | 3/2002 | Watanabe et al. |
| 6,824,253 B2 | 11/2004 | Hoisington et al. |
| 7,204,586 B2 | 4/2007 | Hoisington et al. |
| 2001/0042291 A1 | 11/2001 | Esashi et al. |
| 2003/0112319 A1 | 6/2003 | Hoisington et al. |
| 2005/0133479 A1 | 6/2005 | Youngner et al. |
| 2005/0146401 A1 | 7/2005 | Tilmans et al. |
| 2005/0218755 A1* | 10/2005 | Song et al. ............... 310/348 |
| 2006/0214542 A1 | 9/2006 | Iwashita et al. |
| 2006/0227179 A1 | 10/2006 | Temple et al. |
| 2006/0286829 A1 | 12/2006 | Kim et al. |
| 2007/0000864 A1 | 1/2007 | Abe et al. |
| 2008/0020573 A1 | 1/2008 | Birkmeyer et al. |
| 2009/0101997 A1* | 4/2009 | Lammel et al. ............... 257/415 |
| 2009/0155728 A1 | 6/2009 | Locascio et al. |
| 2010/0167433 A1 | 7/2010 | Lee et al. |

* cited by examiner

FORMING A DEVICE HAVING A CURVED PIEZOELECTRIC MEMBRANE

CLAIM OF PRIORITY

This application is a 371 application of international application number PCT/US2011/045057, filed on Jul. 22, 2011, which claims priority to U.S. Provisional application No. 61/367,827, filed on Jul. 26, 2010. The contents of each of these applications are hereby incorporated by reference in their entireties.

TECHNICAL FIELD

This specification relates to fabrication of MEMS actuators.

BACKGROUND

A fluid ejection system typically includes a fluid path from a fluid supply to a nozzle assembly that includes nozzles from which fluid drops are ejected. Fluid drop ejection can be controlled by pressurizing fluid in the fluid path with an actuator, such as a piezoelectric actuator. The fluid to be ejected can be, for example, an ink, electroluminescent materials, biological compounds, or materials for formation of electrical circuits.

A printhead module in an ink jet printer is an example of a fluid ejection system. A printhead module typically has a line or an array of nozzles with a corresponding array of ink paths and associated actuators, and drop ejection from each nozzle can be independently controlled by one or more controllers. The printhead module can include a semiconductor printhead body in which the ink paths are formed and piezoelectric actuators attached to the printhead body. A nozzle can be defined by a separate layer that is attached to the printhead body. The printhead body can be made of a silicon substrate etched to define a pumping chamber along an ink path.

One side of the pumping chamber is a membrane that is sufficiently thin to flex and expand or contract the pumping chamber when driven by the piezoelectric actuator. The piezoelectric actuator is supported on the membrane over the pumping chamber. The piezoelectric actuator includes a layer of piezoelectric material that changes geometry (or actuates) in response to a voltage applied across the piezoelectric layer by a pair of opposing electrodes. The actuation of the piezoelectric layer causes the membrane to flex, and the flexing of the membrane thereby pressurizes ink in the pumping chamber along the ink path and eventually ejects an ink droplet out of the nozzle.

As a printhead module gets smaller, so do the pumping chambers and corresponding actuators, but smaller actuators eject smaller drops (e.g., 5 pL or less). Small drops are desirable when printing resolutions around 1200 dpi, but smaller drops may not work well when printing lower resolutions, such as around 600 dpi. To print at 600 dpi resolution, bigger drops are necessary (e.g., 9-10 pL). It is therefore desirable to have piezoelectric actuators that are capable of higher volume displacement while having a smaller footprint on the printhead die.

SUMMARY

This specification describes technologies related to MEMS actuators.

The processes for forming an actuator having a curved piezoelectric membrane disclosed herein utilize a profile-transferring substrate having a curved surface surrounded by a planar surface. The piezoelectric material used for the piezoelectric actuator is deposited on at least the curved surface of the profile-transferring substrate before the profile-transferring substrate is removed from the underside of the curved piezoelectric membrane. The resulting curved piezoelectric membrane includes grain structures that are columnar and aligned, and all or substantially all of the columnar grains are locally perpendicular to the curved surface of the piezoelectric membrane.

Particular implementations of the subject matter described in this specification can be implemented so as to realize one or more of the following advantages.

The curved piezoelectric membrane having such aligned and perpendicularly oriented grain structures can experience less internal stress than curved piezoelectric membrane formed by other methods, such as by grinding a curved surface into a bulk piezoelectric material or by injection molding.

Curved piezoelectric membranes having a smaller amount of internal stress can have improved deflection efficiencies as compared to a curved piezoelectric membrane having a larger amount of internal stress due to misaligned and random grain structures. In addition, piezoelectric membranes under stress may degrade more quickly, leading to a shorter useful life for the piezoelectric actuators; the curved piezoelectric membrane formed by the process disclosed can have a longer life.

Without being limited to any particular theory, the region in the piezoelectric membrane directly above the pumping chamber edge experiences higher internal stress during actuation than other regions in the piezoelectric membrane. The transitional region between the curved portion and the planar portion of the piezoelectric membrane has a less aligned grain structure than the portions of the piezoelectric membrane away from the transitional region. In some implementations, the curved surface of the profile-transferring substrate extends beyond the edge of the pumping chamber cavity in one or more dimensions. The piezoelectric membrane formed over at least the curved portion of the profile-transferring substrate also extends beyond the edge of the pumping chamber cavity. As a result, the transitional region between the curved portion and the planar portion of the piezoelectric membrane is moved away from the edge of the pumping chamber, and a more homogenous region in the curved portion of piezoelectric membrane is supported on the edge of the pumping chamber. Because the more homogeneous portion of the curved piezoelectric membrane can better withstand the higher internal stress caused at the edge of the pumping chamber, this design of the piezoelectric actuator can help prevent breakage of the piezoelectric membrane, and can also improve the lifetime of the piezoelectric actuator.

In conventional photoresist reflow processes for microlens fabrication, a patterned photoresist layer is typically heated and reflown in a non-vacuum environment. The resulting micronlens produced by such processes often includes small voids and bubbles on the surface. In a process disclosed herein, a layer of patterned photoresist is heated and reflown to form domes of photoresist on a substrate in a vacuum environment. When the photoresist domes and the underlying substrate are subsequently etched away such that the curved surfaces of the photoresist domes are transferred to the exposed surface of the underlying substrate, the resulting surface of the underlying substrate can be smoother as compared to the resulting surfaces of the substrate if the photoresist were heated and reflown in a non-vacuum environment. The smoother domed surfaces on the substrate can be used as a negative profile-transferring surface to create smooth dents in a profile-transferring substrate, and to improve the uniformity and smoothness of the piezoelectric layer subsequently deposited on the profile-transferring substrate.

In a process for making a profile-transferring substrate having a concave surface surrounded by a planar surface, a negative profile-transferring substrate having a convex surface surrounded by a planar surface can be prepared first. Then, a layer of polysilicon (or other materials, such as a polymer, PECVD oxide, or amorphous silicon) can be deposited uniformly over the exposed surface of the negative profile-transferring substrate, such that both surfaces of polysilicon layer are also convex relative to the negative profile-transferring substrate. The exposed surface of the polysilicon layer can be planarized and then bonded to a second substrate, such that when the negative profile-transferring substrate is removed to expose the polysilicon layer, the newly exposed surface of the polysilicon layer is concave relative to the second substrate. The second substrate having the bonded polysilicon layer on top can serve as the profile-transferring substrate having a concave surface surrounded by a planar surface. As it is sometimes easier to create negatives of desired surface features in a substrate, the process disclosed herein that utilizes a polysilicon layer (or a layer made of another material, e.g., a polymer, PECVD oxide, or amorphous silicon) to create the desired surface features from their negatives provide a useful alternative to creating the desired surface features directly from a planar substrate.

Where a polysilicon layer is used to create a profile-transferring surface based on the surface features of a negative profile-transferring substrate, the polysilicon layer can be planarized and polished before it is bonded to a planer substrate. The non-uniform grain structures inside the polysilicon layer (e.g., in the curved portions as compared to the planar portions) can sometimes cause variations in polishing rates which results in dishing in regions over the curved portions in the polysilicon layer. In a process described herein, prior to planarizing and polishing the polysilicon layer, the polysilicon layer can be annealed first. Without being limited to any particular theory, the annealing process can help to reduce the non-homogeneity in the polysilicon layer, and therefore, also reduce the variation in polishing rates in different regions of the polysilicon surface. As a result, the surface uniformity and flatness of the polished polysilicon layer can be increased to improve the bonding between the planarized polysilicon layer and the substrate.

In general, in one aspect, a method of fabricating a MEMS actuator includes: forming a curved surface in a first side of a profile-transferring substrate, the first side of the profile-transferring substrate including a planar surface surrounding the curved surface; forming a recess in a second side of the profile-transferring substrate opposite the first side, wherein the recess and the curved surface are aligned; depositing an etch stop layer on the first side of the profile-transferring substrate, the etch stop layer covering at least the curved surface of the profile-transferring substrate; depositing a piezoelectric layer on the etch stop layer, the piezoelectric layer covering at least the curved surface of the profile-transferring substrate; and from a second side of the profile-transferring substrate, etching the profile-transferring substrate in the recess to expose the etch stop layer.

In some implementations, the curved surface in the first side of the profile-transferring substrate is concave relative to the planar surface in the first side of the profile-transferring substrate.

In some implementations, the curved surface in the first side of the profile-transferring substrate is convex relative to the planar surface in the first side of the profile-transferring substrate.

In some implementations, forming a curved surface in a first side of a profile-transferring substrate further includes: depositing a layer of photoresist on the first side of the profile-transferring substrate, the first side of the profile-transferring substrate being substantially planar before the photoresist is deposited; forming a curved surface in a first side of the photoresist layer, the first side of the photoresist layer including a planar surface surrounding the curved surface, and the curved surface in the first side of the photoresist layer aligned with the recess; and etching the photoresist layer and the profile-transferring substrate from the first side of the photoresist layer to transfer a profile of the photoresist layer to the first side of the profile-transferring substrate.

In some implementations, forming a curved surface in a first side of the photoresist layer further includes: exposing the first side of the photoresist layer to UV light through a grayscale photomask for a predetermined duration, wherein the grayscale photomask exposes the photoresist layer to an decreasing amount of UV light with increasing radial distance from the center of the recess; and developing the photoresist layer after the UV light exposure.

In some implementations, etching the photoresist layer and the substrate layer from the first side of the photoresist layer to transfer a profile of the photoresist layer to the first side of the profile-transferring substrate further includes: etching the first side of the photoresist layer and the first side of the profile-transferring substrate to a selected anisotropic etchant, wherein the selected anisotropic etchant has approximately equal selectivity for materials of the photoresist layer and the profile-transferring substrate; and stopping the etching when the photoresist layer has been completely removed.

In some implementations, forming a curved surface in a first side of a profile-transferring substrate further includes: depositing a layer of photoresist on the first side of the profile-transferring substrate, the first side of the profile-transferring substrate being substantially planar before the photoresist is deposited; forming a curved surface in a first side of the photoresist layer, the curved surface in the first side of the photoresist layer aligned with the recess; and etching the photoresist layer and the profile-transferring substrate from the first side of the photoresist layer to transfer a profile of the photoresist layer to the first side of the profile-transferring substrate.

In some implementations, forming a curved surface in a first side of the photoresist layer further includes: patterning the photoresist layer such that only a portion of the photoresist layer above the recess remains on the first side of the profile-transferring substrate; heating the photoresist layer remaining on the first side of the profile-transferring substrate such that the photoresist layer reflows to form a photoresist dome on the first side of profile-transferring substrate; and cooling the photoresist layer such that the photoresist dome solidifies on the first side of the profile-transferring substrate.

In some implementations, etching the photoresist layer and the substrate layer from the first side of the photoresist layer to transfer a profile of the photoresist layer to the first side of the profile-transferring substrate further includes: etching the first side of the photoresist layer and the first side of the profile-transferring substrate to a selected anisotropic etchant, wherein the selected anisotropic etchant has approximately equal selectivity for materials of the photoresist layer and the profile-transferring substrate; and stopping the etching when the photoresist layer has been completely removed.

In some implementations, forming a curved surface in a first side of a profile-transferring substrate further includes: forming a negative profile-transferring substrate, the negative profile-transferring substrate having a curved surface in a first side of the negative profile-transferring substrate, and the curved surface in the first side of the negative profile-transferring substrate being surrounded by a planar surface; depositing a first semiconductor layer on the first side of the negative profile-transferring substrate such that a first side of the semiconductor layer conforms to the curved surface and the planar surface of the first side of the negative profile-transferring substrate; and removing the negative profile-transferring substrate from the first side of the negative profile-transferring substrate until the first side of the first semiconductor layer is exposed, the exposed first side of the first semiconductor layer including the curved surface and the planar surface of the profile-transferring substrate.

In some implementations, the method further includes: prior to removing the negative profile-transferring substrate, (1) planarizing a second side of the first semiconductor layer opposite to the first side of the first semiconductor layer; and (2) bonding the second side of the first semiconductor layer to a first side of a second semiconductor layer, the second semiconductor layer and the first semiconductor layer forming at least part of the profile-transforming substrate that contains the recess.

In some implementations, forming a negative profile-transferring substrate further includes: depositing a layer of photoresist on the first side of the negative profile-transferring substrate, the first side of the negative profile-transferring substrate being substantially planar before the photoresist is deposited; forming a curved surface in a first side of the photoresist layer; etching the photoresist layer and the negative profile-transferring substrate from the first side of the photoresist layer to transfer a profile of the photoresist layer to the first side of the negative profile-transferring substrate; and forming a layer of oxide over at least the first side of the negative profile-transferring substrate.

In some implementations, the first semiconductor layer is made of polysilicon.

In some implementations, the profile-transferring substrate include a profile transferring layer and a pumping chamber layer, the profile transferring layer includes the curved surface in the first side of the profile-transferring substrate, and the pumping chamber layer includes the recess, and forming a recess in a second side of the profile-transferring substrate opposite the first side further includes: forming the recess in the pumping chamber layer; and bonding pumping chamber layer to the profile transferring layer.

In some implementations, depositing an etch stop layer on the first side of the profile-transferring substrate includes: oxidizing the first side of the profile-transferring substrate.

In some implementations, depositing an etch stop layer on the first side of the profile-transferring substrate includes: depositing a metal layer on the first side of the profile-transferring substrate.

In some implementations, depositing a piezoelectric layer on the etch stop layer further includes: sputtering a piezoelectric material on a first side of the etch stop layer, the sputtered piezoelectric material covering at least the curved surface of the profile-transferring substrate.

In some implementations, depositing a piezoelectric layer on the etch stop layer further includes: forming a uniform layer of piezoelectric material on a first side of the etch stop layer; and patterning the uniform layer of piezoelectric material to form a piezoelectric membrane that includes a curved portion covering the curved surface of the profile-transferring substrate and a planar portion that extends beyond the curved surface of the profile-transferring substrate.

In some implementations, the method further includes: prior to depositing the piezoelectric layer on the etch stop layer, depositing a lower metal layer on the etch stop layer; and after depositing the piezoelectric layer on the etch stop layer; depositing an upper metal layer on the piezoelectric layer.

In some implementations, the method further includes: attaching a nozzle layer to the second side of the profile-transferring substrate, the nozzle layer includes a nozzle feature and the nozzle feature and the recess are aligned.

In general, one aspect includes a method for forming a curved surface in a profile-transferring substrate. The method includes: forming a negative profile-transferring substrate, the negative profile-transferring substrate having a curved surface in a first side of the negative profile-transferring substrate, and the curved surface in the first side of the negative profile-transferring substrate being surrounded by a planar surface; depositing an etch stop layer over at least the curved surface in the first side of the negative profile-transferring substrate; depositing a first semiconductor layer on a first side of the negative profile-transferring substrate over the etch stop layer such that a first side of the semiconductor layer conforms to the curved surface and the planar surface of the first side of the negative profile-transferring substrate; and removing the negative profile-transferring substrate from the first side of the negative profile-transferring substrate until the etch stop layer is exposed, an exposed first side of etch stop layer and the first side of the first semiconductor layer including an inversion of at least the curved surface in the first side of negative profile-transferring substrate.

In some implementations, the curved surface in the first side of the negative profile-transferring substrate is convex relative to the negative profile-transferring substrate, and the curved surface in the profile-transferring substrate is concave relative to the profile-transferring substrate.

In some implementations, forming a negative profile-transferring substrate further includes: depositing a layer of photoresist on the first side of the negative profile-transferring substrate, the first side of the negative profile-transferring substrate being substantially planar before the photoresist is deposited; forming a curved surface in a first side of the photoresist layer; and etching the photoresist layer and the negative profile-transferring substrate from the first side of the photoresist layer to transfer a profile of the first side of the photoresist layer to the first side of the negative profile-transferring substrate.

In some implementations, forming a curved surface in a first side of the photoresist layer further includes: patterning the photoresist layer such that only a portion of the photoresist layer at an intended location of the curved surface of the profile-transferring substrate remains on the negative profile-transferring substrate; heating the photoresist layer remaining on the first side of the negative profile-transferring substrate such that the photoresist layer reflows to form a photoresist dome on the first side of profile-transferring substrate; and cooling the photoresist layer such that the photoresist dome solidifies on the first side of the negative profile-transferring substrate.

In some implementations, heating the photoresist layer is performed in a vacuum environment.

In some implementations, the method further includes: prior to removing the negative profile-transferring substrate, (1) planarizing a second side of the first semiconductor layer opposite to the first side of the first semiconductor layer; and (2) bonding the second side of the first semiconductor layer to a first side of a second semiconductor layer to form the profile-transferring substrate.

In some implementations, the method further includes: prior to planarizing the second side of the first semiconductor layer, annealing the first semiconductor layer at a high temperature.

In some implementations, planarizing the second side of the first semiconductor layer further includes: first polishing the second side of the first semiconductor layer using a low pH silicon slurry to remove the curved surface in the second side of the first semiconductor layer; and after the first polishing, second polishing the second side of the first semiconductor layer using a high pH oxide slurry to smoothen the second side of the first semiconductor layer.

In some implementations, the first semiconductor layer is made of polysilicon.

The details of one or more implementations of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

Many of the layers and features are exaggerated to better show the process steps and results. Like reference numbers and designations in the various drawings indicate like elements.

DETAILED DESCRIPTION

A MEMS actuator having a curved piezoelectric membrane can be formed using a profile-transferring substrate having a curved surface surrounded by a planar surface. The piezoelectric material used for the piezoelectric actuator is deposited on at least the curved surface of the profile-transferring substrate before the profile-transferring substrate is removed from the underside of the curved piezoelectric membrane. The resulting curved piezoelectric membrane includes grain structures that are columnar and aligned, and all or substantially all of the columnar grains are locally perpendicular to the curved surface of the piezoelectric membrane. Several processes can be used to form the curved features on a profile transferring substrate. The actuator having the curved piezoelectric membrane can be used in fluid droplet ejection, for example.

Fluid droplet ejection can be implemented with a printhead module which includes a die fabricated using semiconductor processing techniques. The printhead die includes a substrate in which a plurality of microfabricated fluid flow paths are formed, and a plurality of actuators to cause fluid to be selectively ejected from nozzles of the flow paths. Thus, each flow path with its associated actuator provides an individually controllable microelectromechanical (MEMS) fluid ejector unit.

An Exemplary Fluid Ejection System

Figure 1A:
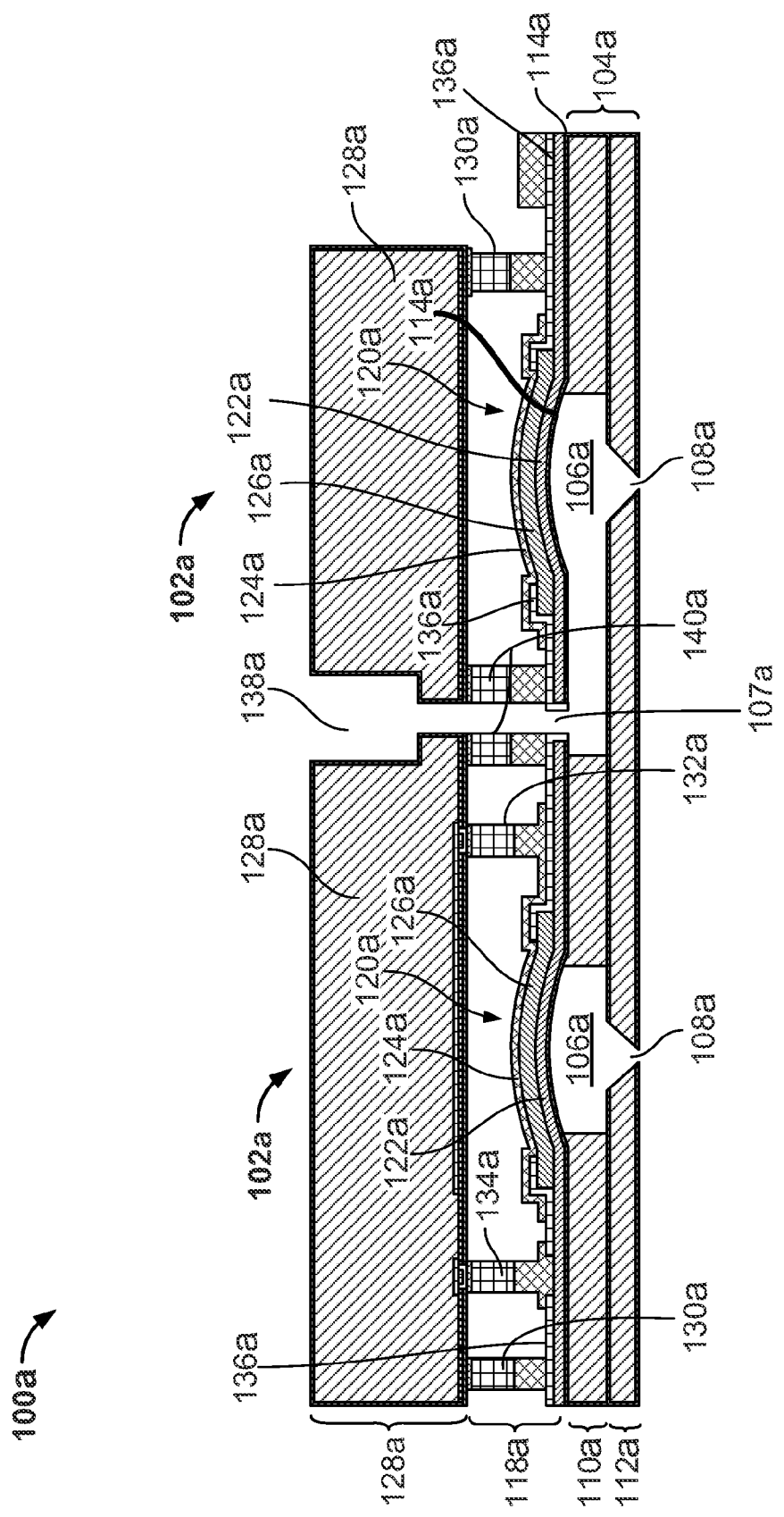
FIG. 1A is a schematic cross-sectional view of a printhead die in an example fluid ejection module having a convex piezoelectric actuator.

FIG. 1A is a schematic cross-sectional view of a portion of an exemplary fluid ejection system, e.g., a printhead die 100a in a printhead module.

The printhead die 100a includes a flow path body 104a through which a plurality of passages are formed. The flow path body 104a can be a single body, e.g., semiconductor body, such as a silicon substrate, or include multiple layers, e.g., a semiconductor body with one or more other layers thereon, such as a silicon substrate bonded to a poly-silicon layer, for example. Alternatively, a dielectric body, e.g., a glass substrate, can be substituted for the semiconductor body in the flow path body 104a. Each passage through the flow path body 104a defines a flow path for the fluid (e.g. ink) to be ejected.

Each flow path passage can include a fluid inlet 107a, a pumping chamber 106a, and a fluid ejection nozzle 108a. Fluid enters the pumping chamber 106a through the fluid inlet 107a, and can be ejected through the fluid ejection nozzle 108a. Optionally, fluid not ejected out of the fluid ejection nozzle 108a can exit the pumping chamber 106a through a fluid outlet. The fluid inlet can be connected to a fluid supply channel, and the fluid outlet can be connected to a fluid return channel. Each fluid supply channel and fluid return channel can be shared by multiple fluid ejection units 102a in the printhead die 100a.

The flow path body 104a can include a pumping chamber layer 110a attached to the top side of a nozzle layer 112a. The pumping chamber 106a is a cavity formed in the pumping chamber layer 110a. The fluid ejection nozzle 108a is an aperture formed through the nozzle layer 112a. The fluid ejection nozzle 108a connects to the pumping chamber cavity on one side and has an opening on the bottom surface of nozzle layer 112a on the opposite side.

The pumping chamber 106a can have straight side walls, or slightly tapered side walls going from the top edge of the pumping chamber 106a towards the bottom edge of the pumping chamber 106a near the nozzle 108a. The nozzle 108a can be tapered from top to bottom as well.

The flow path body 104a can also optionally include a membrane layer 114a attached to the top side of the pumping chamber layer 110a. The membrane layer 114a can be an oxide layer that seals the pumping chamber 106a from above. The portion of the membrane layer 114a over the pumping chamber cavity 106a is flexible and capable of flexing under the actuation of a piezoelectric actuator. The flexing of the membrane expands and contracts the pumping chamber cavity 106a and pump the fluid along the flow path.

Above the membrane layer 114a is an actuation assembly 118a. The actuation assembly 118a includes a plurality of piezoelectric actuator structures 120a disposed on the flow path body 104a, with each actuator structure 120a positioned over an associated pumping chamber 106a. The piezoelectric actuator structures 120a can be supported on the top side of the membrane layer 114a. If the membrane layer 114a does not exist in a particular embodiment, the actuation assembly 118a can be disposed directly on the top side of the pumping chamber layer 110a, and the bottom surface of the piezoelectric structure 120a can seal the pumping chamber 106a from above.

The piezoelectric actuator structure 120a includes a first electrode layer (e.g., a reference electrode layer 122a), a second electrode layer (e.g., a drive electrode layer 124a), and a piezoelectric layer 126a disposed between the first and the second electrode layers. The drive electrode layer 124a can be patterned to form a drive electrode above the pumping chamber 106a. Although illustrated with the reference electrode layer 122a on the side of the piezoelectric layer 126 closer to the flow path body 104a and the drive electrode layer 124a on the side of the piezoelectric layer 126 farther from the flow path body 104a, the reverse is possible. The piezoelectric layer 126a can also be patterned to form a segmented piece or piezoelectric membrane above each pumping chamber 106. Optionally, the reference electrode layer 122a can be patterned to form a segmented reference electrode for each pumping chamber 106a.

The piezoelectric membrane of the piezoelectric actuator structure 120a expands or contracts in response to a voltage applied across the piezoelectric membrane between the drive electrode and the reference electrode. The expansion and contraction of the piezoelectric membrane causes the membrane over the pumping chamber 106a to change geometry, and in turn causes the pumping chamber 106a to expand or contract. The expansion of the pumping chamber 106a draws the fluid along the flow path into the pumping chamber 106a, and the contraction of the pumping chamber 106a forces a fluid droplet through and out of the fluid ejection nozzle 108a.

Each pumping chamber 106a with its associated actuator structure 120a provides an individually controllable fluid ejection unit. The drive electrode and the reference electrode for each actuator can be electrically coupled to a controller which supplies the voltage differential across the piezoelectric membrane of the actuator at appropriate times and for appropriate durations in a fluid ejection cycle.

In some implementations, the controller can be implemented at least in part in an application-specific integrated circuit (ASIC) wafer 128a disposed above the actuation layer 118a. The ASIC wafer 128a can be supported above the actuation layer 118a by a plurality of spacer bumps 130a to allow room for the flexing of the piezoelectric actuator structure 120a. The controller inside the ASIC wafer 128a can be coupled to the drive electrode and the reference electrode, e.g., by a pair of electrode connection bumps 132a and 134a and by conductive traces formed on, for example, a dielectric layer 136a. In some implementations, a plurality of electrode connection bumps 132a and 134a can serve as the spacer bumps. In some implementations, the controller can be implemented at least in part, e.g., entirely, by circuitry that is not supported on the flow-path substrate 104a, e.g., by a separate circuitry coupled to the actuator structures 120a. For example, a separate controller can be coupled to the drive electrode and the reference electrode by a flex circuit that attaches to the conductive traces at the edge of the substrate 104a.

In some implementations, a patterned dielectric layer 136a can be deposited between the drive electrode layer 124a and the reference electrode layer 122a to insulate the drive electrode from the reference electrode. Optionally, the patterned dielectric layer 136a can also cover a peripheral planar portion of the piezoelectric membrane to isolate the drive electrode from the planar portion of the piezoelectric membrane.

In some implementations, a fluid supply channel 138a can be formed in the ASIC wafer 128a. The fluid supply channel 138a can be connected to the fluid inlet 107a of the flow path by an annular metal seal 140a. Similarly, a fluid return channel can also be formed in the ASIC wafer 128a. The fluid return channel can be connected to the fluid outlet of the flow path.

In a conventional piezoelectric actuator, the piezoelectric membrane is made of a piezoelectric material that is substantially planar, such as a lead zirconium titanate ("PZT") film. The planar piezoelectric material needs to thin enough such that sufficient flexing can be produced under an applied voltage to cause a desired amount of volume change in the pumping chamber. At the same time, the piezoelectric material also needs to be thick enough so that it is sufficiently stiff to apply enough pressure to eject the fluid droplet out of the nozzle.

Piezoelectric actuators having a curved piezoelectric membrane over the pumping chamber have been proposed. The curved piezoelectric membrane over the pumping chamber has a larger surface area and can cause an increased amount of volume change in the pumping chamber under a given applied voltage than a planar piezoelectric membrane. At the same time, the curved piezoelectric membrane can be stiffer than a planar piezoelectric membrane that can cause the same amount of volume change under a given applied voltage. For example, a curved piezoelectric membrane can have a volume displacement 4-5 times that of a planar piezoelectric membrane (e.g., 9 pL versus 2 pL), for a pumping chamber having a lateral dimension of 200 microns and a height of 11 microns.

When piezoelectric actuators with curved piezoelectric membranes are used, the pumping chambers can be made smaller and packed more densely in a fluid ejection system to improve printing resolution. In addition, with increased stiffness of the piezoelectric membrane, the firing frequency of the actuators can be increased as well to improve printing speed.

Figure 1B:
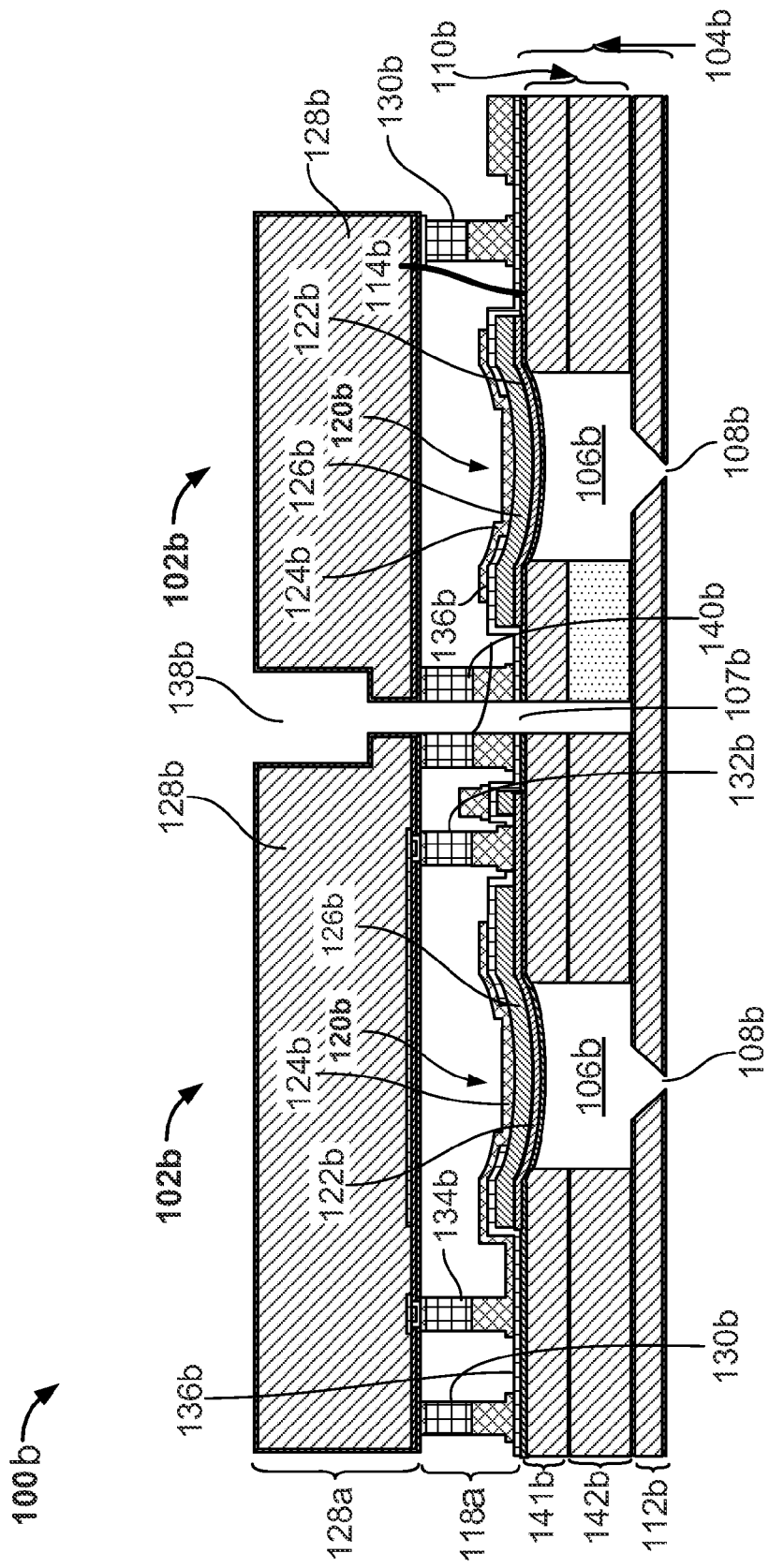
FIG. 1B is a schematic cross-sectional view of a printhead die in another example fluid ejection module having a concave piezoelectric actuator.

As shown in the example printhead module 100a, each layer of the piezoelectric actuator structure 120a includes a curved portion over the pumping chamber 106a. In the example printhead module 100a shown in FIG. 1A, the curved portion is convex relative the pumping chamber cavity 106a. In an alternative embodiment, the curved portion can be concave relative to the pumping chamber. FIG. 1B illustrates a schematic diagram of an example fluid ejection module 100b that has a concave actuator structure 120b over a pumping chamber 106b. The structure of the printhead die 100b corresponds to that of the printhead die 100a, except for the direction of the curved piezoelectric actuator structure relative to the pumping chamber. In some implementations, the pumping chamber layer 110b includes a polysilicon layer 141b and a silicon layer 142b, as a result of the processing steps used to form the printhead module 100b.

Figure 2A:
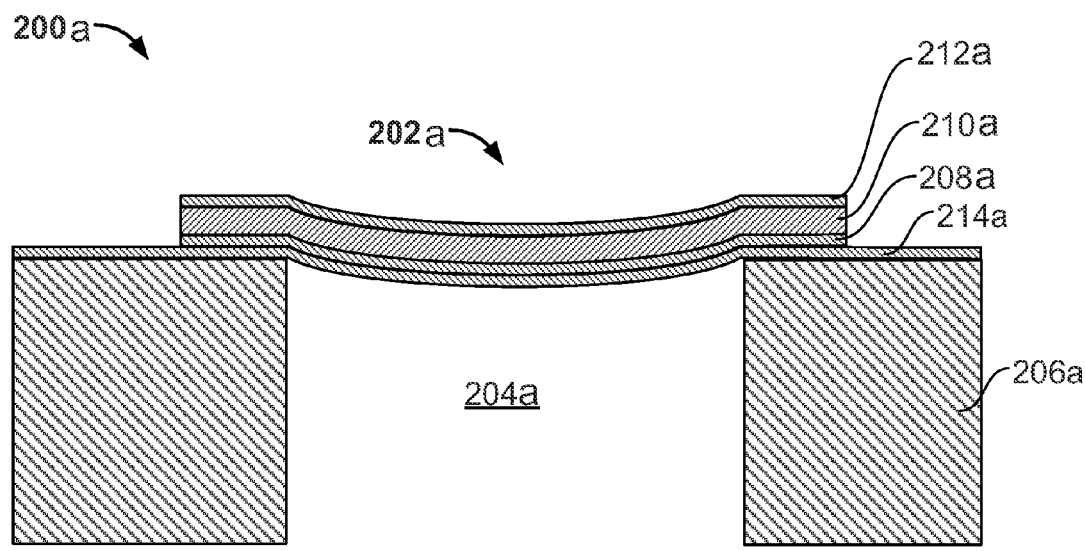
FIG. 2A is a schematic cross-sectional view of an example pumping chamber having a concave piezoelectric actuator.
Figure 2B:
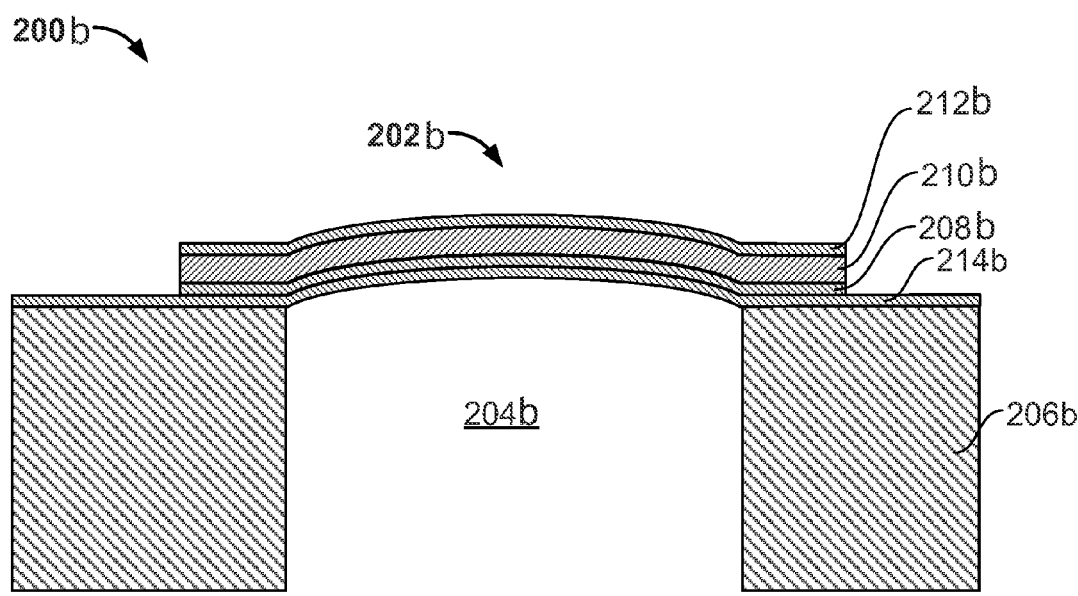
FIG. 2B is a schematic cross-sectional view of an example fluid ejection unit having a convex piezoelectric actuator.

FIG. 2A is a schematic diagram of an example fluid ejection unit 200a having a concave dome actuator 202a. FIG. 2B is a schematic diagram of an example fluid ejection unit 200b having a convex dome actuator 202b. The fluid ejection unit 200 (e.g., 200a and 200b) includes a pumping chamber 204 formed within a pumping chamber layer 206 (e.g., a silicon layer). The example piezoelectric actuator 202 includes a back electrode 208 (e.g., formed from a patterned Iridium layer), a piezoelectric layer 210 (e.g., formed from a sputtered PZT film), and a top electrode 212 (e.g., formed from a metal). In some implementations, the top electrode may serve as the drive electrode while the back electrode serves as the reference electrode. In some implementations, the reverse may be possible. The piezoelectric actuator 202 is supported on a membrane layer 214 (e.g., a SiO$_2$ layer or a SiN layer).

In some implementations, the lateral cross-section (i.e., the area in a plane parallel to the surface of the flow path substrate) of the curved portion can be circular, elliptical, or rectangular, for example. The vertical cross-section (i.e., the area in a plane perpendicular to the surface of the flow path substrate) of the curved portion can be a symmetric segment of a circle, an ellipse, a hyperbola, a parabola, or other concave or convex curves. In some implementations, the vertical cross-sections of the curved portion in two orthogonal directions can be the same, such as in a spherical dome. In some implementations, the vertical cross-sections of the curved portion in two orthogonal directions can be different, such as in a dome having an elliptical lateral cross-section or a cylindrical shell having a rectangular lateral cross-section. In some implementations, the lateral dimensions of the curved portion of the piezoelectric membrane 210 are approximately equal to the lateral dimensions of the pumping chamber cavity. As illustrated with respect to FIGS. 4A-4C, the lateral dimensions of the curved portion of the piezoelectric membrane can be made slightly larger than the lateral dimensions of the pumping chamber cavity (e.g., by 2-20 microns) to improve the lifetime of the piezoelectric actuator. Since increased volume displacement under a given driving voltage can be possible with any number of configurations to increase the surface area of the piezoelectric membrane, the choice of the particular shape and configuration of the piezoelectric membrane can also take into account the effect of the shape on compliance of the membrane. Flatter surfaces (e.g., as in a pyramid-shaped structure) would result in more compliance than a curved surface (e.g., as in a hemispherical or ellipsoidal structure).

Previously, it has been suggested that the curved piezoelectric membrane in a piezoelectric actuator can be formed by grinding a pair of curved surfaces into a layer of piezoelectric material (e.g., bulk PZT) or by injection molding a precursor into a mold having the desired curved surface features for the piezoelectric membrane. However, these conventional methods are costly and time consuming. The control on the size of the curved feature is limited by the tools that are used to grind the piezoelectric material or to form the mold. In addition, the grain structures inside a curved piezoelectric membrane formed by grinding or injection molding are misaligned and random. The random grain structures can introduce a large amount of internal stress in the curved piezoelectric membrane when the curved piezoelectric membrane is actuated, leading to shortened actuator life.

This specification describes example processes for making actuators having curved piezoelectric membranes, particularly in fluid ejection modules. In these example processes, a substrate having a curved surface surrounded by a planar surface is first prepared. The surface of the substrate (including the curved portions surrounded by the planar portion) acts as a profile-transferring surface from which the curved surfaces of the piezoelectric membrane can be formed. The substrate is therefore a "profile-transferring substrate." A layer of piezoelectric material can be uniformly deposited on at least the curved surface of the profile-transferring substrate, such that the surface features of the profile-transferring substrate is formed in the piezoelectric layer.

Optionally, an etch stop layer (e.g., an oxide layer, a nitride layer, or a metal layer) can be applied to at least the curved surface of the profile-transferring substrate before the piezoelectric membrane is deposited. After the piezoelectric membrane is formed over the etch stop layer, a portion of the profile-transferring substrate within the pumping chamber cavity can be etched from the underside of the substrate until the etch stop layer is exposed. As a result, a curved piezoelectric layer having two parallel curved surfaces can be created.

In some implementations, the curved piezoelectric membrane can be lifted off the profile-transferring substrate, e.g., by etching or other lift-off methods. The isolated piezoelectric membrane can then be bonded to a substrate layer including the pumping chamber.

Suitable methods for depositing the piezoelectric material over the etch stop layer or profile-transferring substrate include, for example, sputtering, chemical vapor deposition, physical vapor deposition, atomic layer deposition, plasma-enhanced chemical vapor deposition, and so on. Types of sputter deposition can include magnetron sputter deposition (e.g., RF sputtering), ion beam sputtering, reactive sputtering, ion assisted deposition, high target utilization sputtering, and high power impulse magnetron sputtering. Sputtered piezoelectric material (e.g., piezoelectric thin film) can have a large as deposited polarization. Some environments that are used for sputtering the piezoelectric material include a direct current (DC) bias during sputtering. The DC field causes the piezoelectric material to be polarized (or "poled") in the direction of the DC field.

In some implementations, the as deposited poling direction in the deposited piezoelectric layer (e.g., sputtered PZT) can be locally perpendicular to the surface of the underlying profile-transferring substrate, and pointing in a direction away from the substrate surface. The desired poling direction in the piezoelectric membrane can be obtained by depositing on a profile-transferring substrate that would produce the desired poling direction as deposited. Alternatively, the piezoelectric membrane can be deposited on a profile-transferring substrate that would produce the opposite poling direction as desired, and the piezoelectric membrane can be subsequently flipped over and bonded to another substrate to obtained the desired poling direction.

Without being limited to any particular theory. The as-deposited poling direction of the sputtered PZT points away from the underlying substrate surface along the grain structure of the sputtered PZT. Therefore, the as-deposited poling direction is substantially locally perpendicular to the surface of the sputtered PZT membrane. Such as-deposited poling direction of the sputtered PZT membrane can reduce the stress in the PZT membrane during actuation, which can result in extended useful life of the PZT actuator.

Figure 3A:
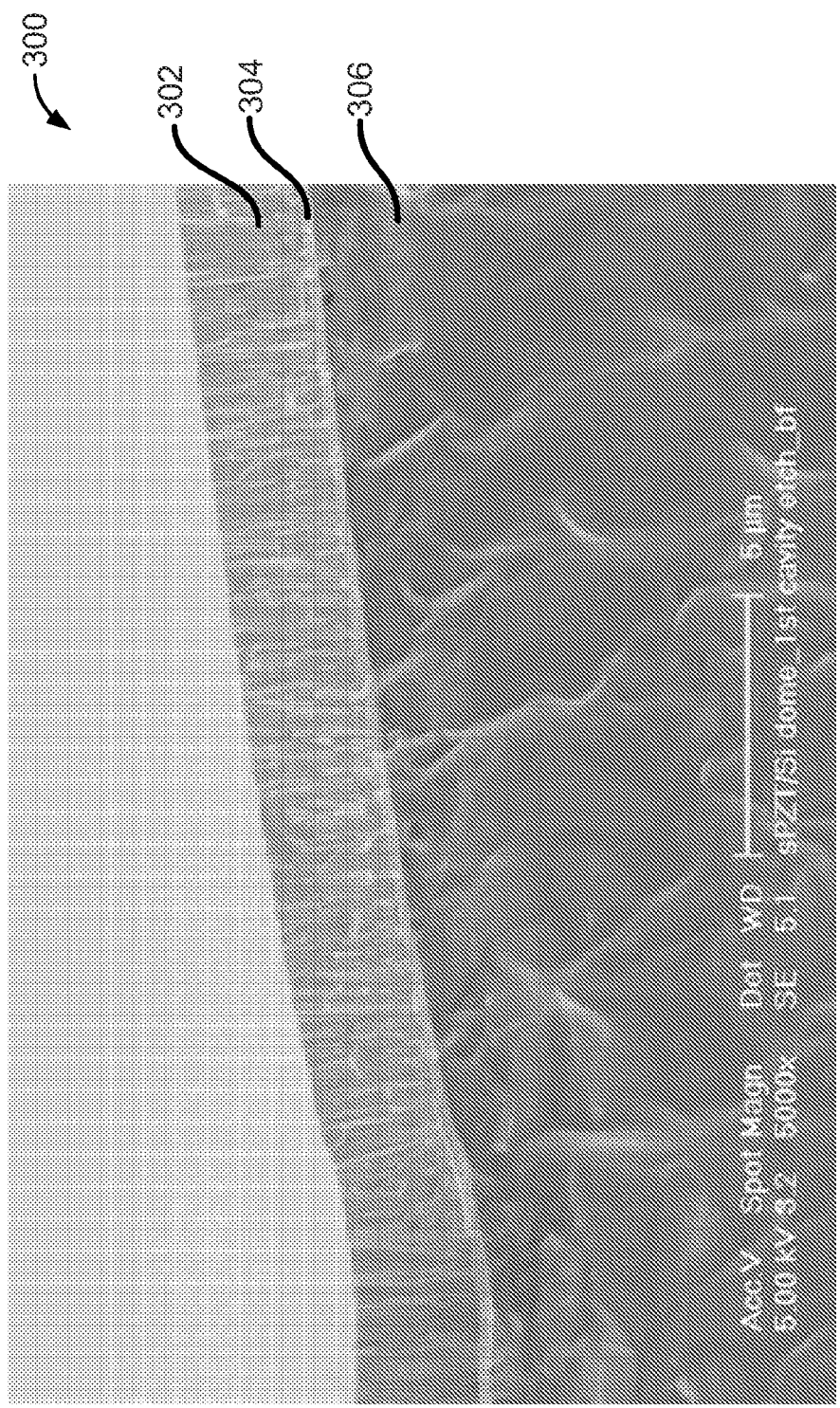
FIG. 3A is an image showing the grain structures within a curved portion of a piezoelectric membrane formed by sputtering over a curved profile-transferring surface.

FIG. 3A shows a Scanning Electronic Microscope (SEM) image 300 of a partial cross-section of a convex piezoelectric membrane over a silicon pumping chamber (not yet formed). The image 300 shows the grain structure of a sputtered PZT layer 302 deposited on a dome-shaped Iridium electrode layer 304. The dome-shaped Iridium electrode layer 304 is suspended over the cavity of the silicon pumping chamber (to be formed) and supported by the silicon layer 306 around the edge of the pumping chamber.

The grain structures within the PZT layer 302 are roughly columnar, and all or substantially all columnar grains are locally perpendicular to the surface of the curved PZT layer 302. The aligned columnar PZT grain structures shown in FIG. 3A occur when the PZT is deposited or grown gradually on a curved underlayer (e.g., on the curved surface of the etch stop layer or profile-transferring substrate). The aligned columnar grain structures that are locally perpendicular to the curved surface of the piezoelectric membrane would not inherently occur in a bulk piezoelectric material that is ground into a curved membrane. Nor would such grain alignment and orientation inherently occur in a curved piezoelectric membrane formed by injection molding.

When the grain structures in the sputtered PZT membrane are aligned and locally perpendicular to the curved surface of the PZT membrane, a reduced amount of localized internal stress occur within the membrane during actuation of the membrane as compared to a membrane that has randomly oriented grain structures (e.g., such as in curved membrane formed from bulk PZT or injection molding). With the reduced amount of localized internal stress in the actuated state, the PZT membrane having aligned columnar grains such as that shown in FIG. 3A enjoy a longer usable life than the membranes produced using other conventional methods (e.g., by grinding or by injection molding).

Figure 3B:
FIG. 3B is an enlarged image of the piezoelectric membrane in FIG. 3A, showing the grain structures within a transitional region between a curved portion and a planar portion of the piezoelectric membrane.

FIG. 3B is an enlarged SEM image 310 of the curved sputtered PZT membrane 302 near a transitional region 312 between a curved portion and a planar portion of the sputtered PZT membrane 302. The grain structures of the sputtered PZT in the transitional region 312 are squeezed toward the center of the transitional region 312. The transitional region 312 is less sturdy during actuation than other regions in the sputtered PZT membrane 302 where the grain structures are more parallel and aligned. Normally, a larger amount of stress is created in the piezoelectric membrane near the edge of the pumping chamber during actuation. As a result, the piezoelectric membrane can be prone to breakage if the pumping chamber edge is placed directly below the transitional region in piezoelectric membrane (e.g., when the curved surface of the piezoelectric membrane has the approximately the same lateral dimensions as the pumping chamber).

In some implementations, the curved portion of the PZT membrane can be made to extend beyond the edge of the pumping chamber. In other words, the edge of the pumping chamber walls can be inside the curved portion of the PZT membrane. In these implementations, the high stress region near the edge of the pumping chamber is moved away from the transitional region to a more homogenous region in the piezoelectric membrane (e.g., regions where the grain structures are more aligned and parallel to one another). By shifting the high stress region, the piezoelectric membrane is less prone to breakage due to the internal stress caused during actuation of the piezoelectric membrane.

Figure 4A:
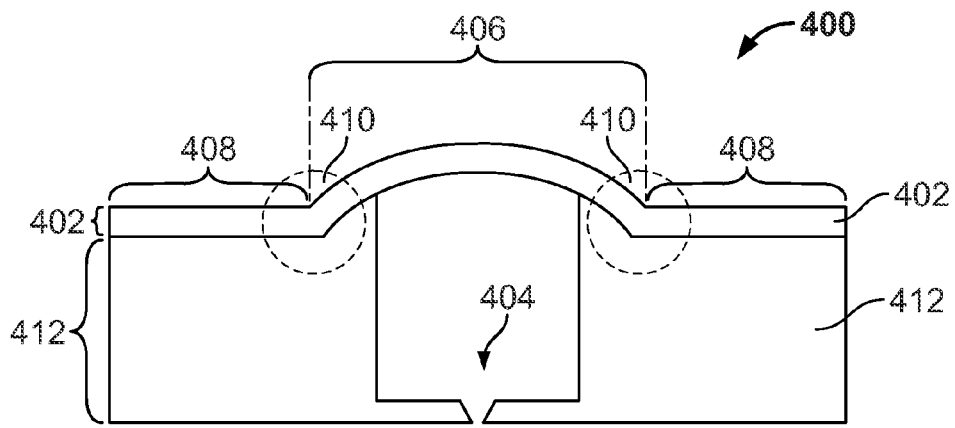
FIGS. 4A-4B are schematics of actuators in which the transitional region between the curved portion and the planar portion of the piezoelectric membrane is beyond the edge of pumping chamber.

FIG. 4A is a schematic of fluid ejection module 400. The fluid ejection module 400 includes a curved piezoelectric membrane 402 disposed over a pumping chamber 404. In the configuration shown in FIG. 4A, the piezoelectric membrane 402 has a convex portion 406 and a planar portion 408 surrounding the convex portion 406. The piezoelectric membrane 402 is roughly uniform in thickness. The convex portion 406 extends beyond the edge of the pumping chamber 404 and is supported underneath by the substrate 412 surrounding the pumping chamber cavity. Therefore, the transitional region 410 that joins the convex portion 406 and the planar portion 408 of the piezoelectric membrane 402 is situated outside of the edge of the pumping chamber 404 and is attached to and supported by the substrate 412.

Figure 4B:
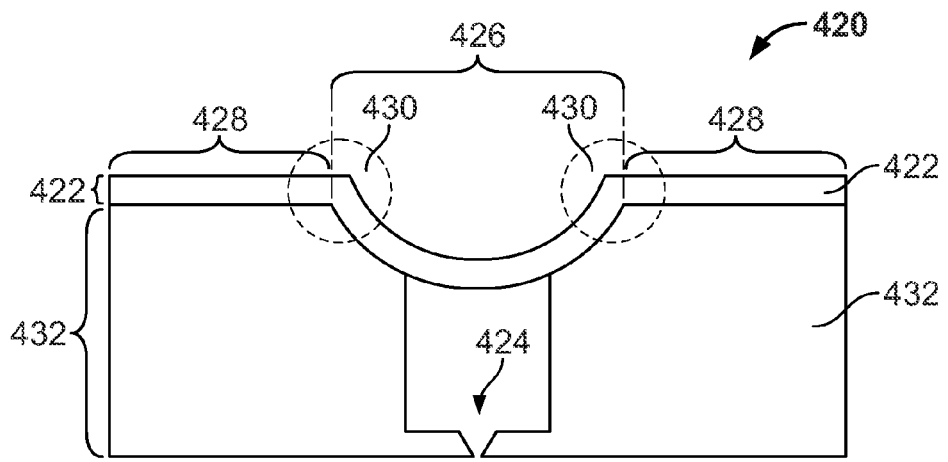

Similarly, FIG. 4B is a schematic of another fluid ejection module 420. The fluid ejection module 420 includes a curved piezoelectric membrane 422 disposed over a pumping chamber 424. In the configuration shown in FIG. 4B, the piezoelectric membrane 422 includes a concave portion 426 and a planar portion 428 surrounding the concave portion 426. The piezoelectric membrane 422 is roughly uniform in thickness. The concave portion 426 extends beyond the edge of the pumping chamber 424 and is supported underneath by the substrate 432 surrounding the pumping chamber cavity. The transitional region 430 that joins the concave portion 426 and the planar portion 428 of the piezoelectric membrane 402 is situated outside of the edge of the pumping chamber 424 and is attached to and supported by the substrate 432.

Figure 4C:
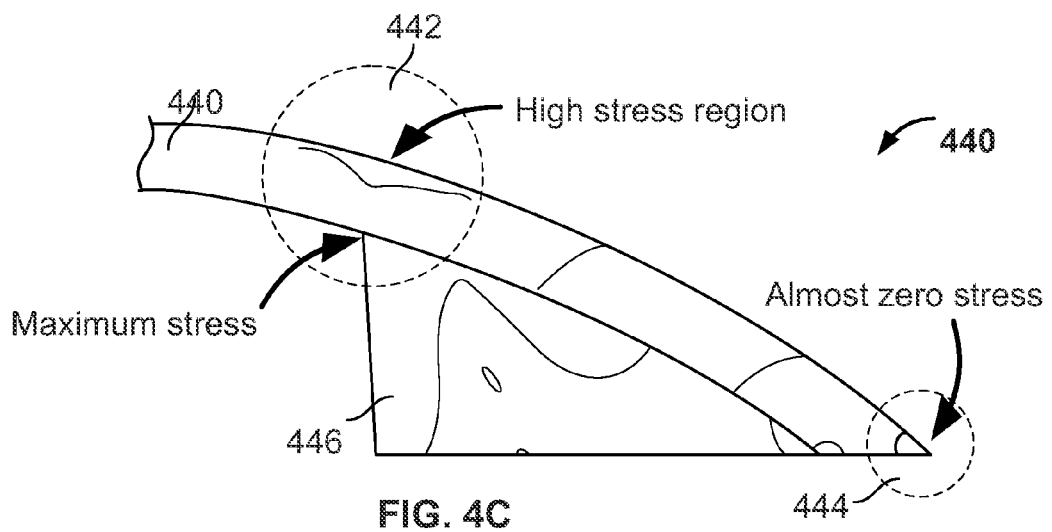
FIG. 4C shows simulated internal stress within the piezoelectric membrane at the transitional region and the region supported by the edge of the pumping chamber for the design shown in FIG. 4A.

FIG. 4C shows the simulated internal stress within the peripheral region of a domed piezoelectric membrane 440 during actuation, where the transitional region 444 between the curved portion and the planar portion is extended outside of the edge of the pumping chamber and supported by the pumping chamber substrate 446 from below. As shown in FIG. 4C, the high stress region 442 is near the edge of the pumping chamber, while the transitional region 444 that joins the curved portion and the planar portion of the piezoelectric membrane 440 has almost negligible internal stress.

As set forth in this specification, the piezoelectric membrane that is grown or deposited on the curved surface of a profile-transferring substrate has aligned columnar grain structures in the region 442. Therefore, the region 442 can better withstand such higher stress near the pumping chamber edge than the transitional region 444. Meanwhile, the weaker transitional region 444 is placed near a region that is under negligible stress. Therefore, by extending the curved portion of the piezoelectric membrane beyond the edge of the pumping chamber, the piezoelectric membrane becomes less prone to breakage during actuation. Although the simulation is based on an actuator having a convex piezoelectric membrane, the same design principle applies to an actuator having a concave piezoelectric membrane.

FIGS. 5A-5D illustrate an example process for forming a pumping chamber cavity in a pumping chamber layer. The pumping chamber layer can be a semiconductor body, and may include one or more semiconductor layers (e.g., a Silicon substrate, a polysilicon layer grown on another substrate, etc.). In some implementations, the pumping chamber cavity can be formed in a pumping chamber layer, and the pumping chamber layer can be subsequently bonded to other layers of the fluid ejection module (e.g., an actuation layer, a handle layer, and so on) at various stages of production. In some implementations, the pumping chamber cavity can be formed in the pumping chamber layer that is already attached to another portion of the fluid ejection module.

Figure 5A:
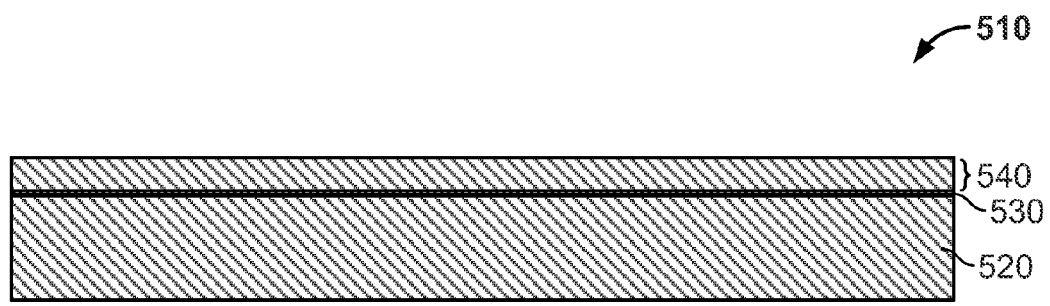
FIGS. 5A-5D illustrate an example process for forming a pumping chamber cavity in a pumping chamber layer of a substrate.

Referring to FIG. 5A, the process starts from a semiconductor wafer (e.g., a silicon-on-oxide ("SOI") wafer) 510. The semiconductor wafer 510 has a layer of a single crystal semiconductor material, such as a silicon layer 540, a handle layer 520, and an oxide layer 530 between the silicon layer 540 and the handle layer 520. The silicon layer 540 can be used as the pumping chamber layer in which the pumping chamber cavity is to be formed. The silicon layer 540 can have a <100> crystal orientation. The handle layer 520 can be made of silicon or other materials.

While the layers can have just about any thickness, the oxide layer 530 is thinner than the silicon layer 540 and the handle layer 520. In an exemplary SOI wafer 510, the oxide layer 530 is less than a few microns thick, such as about 1 micron thick. The handle layer 520 can have a thickness of greater than 200 microns, such as about 600 microns. The silicon layer 540 has a thickness of at least the final desired height of the pumping chamber (e.g., 25 microns). Only a portion of a semiconductor wafer 510 is shown for the sake of simplicity. That is, the creation of only two pumping chambers are illustrated, but in most cases many more pumping chambers can be formed in the silicon layer 540 in the wafer 510.

Figure 5B:
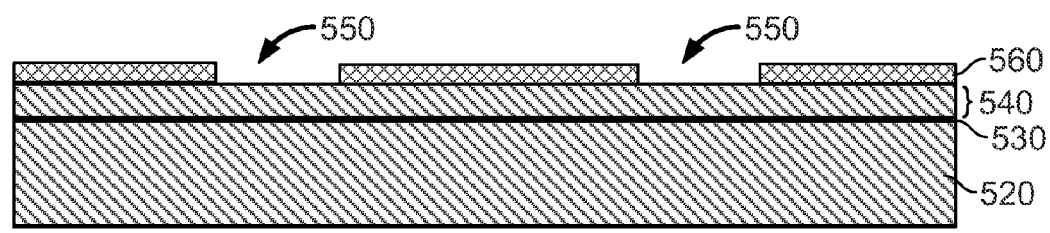

Referring to FIG. 5B, a layer of photoresist 560 is applied to the exposed side of the silicon layer 540. The layer of photoresist 560 is patterned to create openings 550. Each opening 550 has the desired dimensions and cross-sectional shape of the pumping chamber cavity, such as a circle, a square, an ellipse, a rectangle, or another geometric shape. In this example, the opening 550 is a circular opening having a radius of approximately 160 microns. In other implementations, the opening 550 can be a circular opening having a radius of approximately 250 microns. Other dimensions and shapes are possible.

Figure 5C:
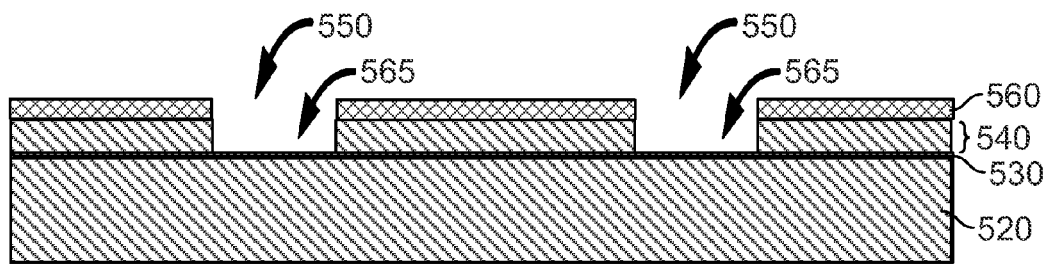

The photoresist layer 560 with the openings 550 can be used as a mask for etching recesses 565 into the silicon layer 540, where each recess corresponds to the cavity of a pumping chamber, as shown in FIG. 5C. Various etching techniques can be used, such as dry etching. An anisotropic etchant can be used to create a straight walled recess or a tapered walled recess in the silicon layer 540. In this example, straight walled recesses have been created.

The etching is stopped when the oxide layer 530 is exposed. In some implementations, the etching is allowed to continue in the pumping chamber cavity 565 until a portion of the oxide layer 530 (e.g., about 0.5 microns of a 1-micron oxide layer) has been etched away. In some implementations, a different etchant can be used to etch the oxide layer 530. In cases where a portion of the oxide layer 530 is etched down, the thickness of the oxide layer 530 is thinner in portions within the pumping chamber walls than portions outside of the pumping chamber walls. By making the oxide layer 530 thinner inside the pumping chamber cavities than outside of the pumping chamber cavities, a thin layer of oxide can remain on the underside of the pumping chamber layer (e.g., the silicon layer 540) when the handle layer 520 and the oxide layer 530 are subsequently removed to expose the pumping chamber cavities. The remaining thin layer of oxide can help facilitate the bonding between the pumping chamber layer and the nozzle layer.

In addition, by making the oxide layer 530 thinner inside the pumping chamber cavities than outside of the pumping chamber cavities, a thin layer of oxide can remain on the underside of the pumping chamber layer (e.g., the silicon layer 540) when the handle layer 520 and the oxide layer 530 are subsequently removed to expose the pumping chamber cavities. The thin oxide layer 530 can act as a marker to stop the etching, such that the depth of the pumping chamber cavity can be accurately controlled.

Figure 5D:
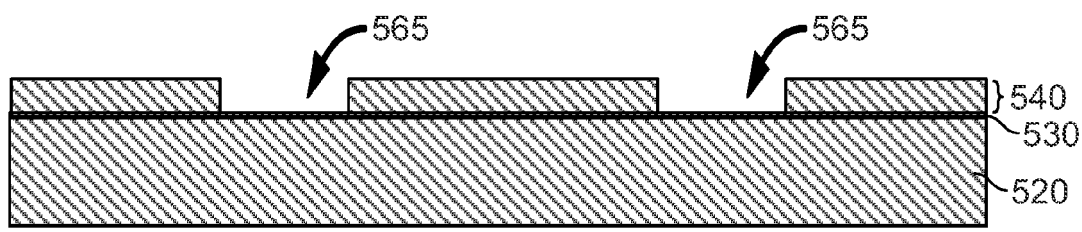

Once the etching has been stopped (e.g., either after the pumping chamber cavities 565 have been formed or after a portion of the oxide layer 530 have been removed inside the pumping chamber cavities), the photoresist layer 560 can be stripped so that the top surface of the silicon layer 540 is exposed, as shown in FIG. 5D. The pumping chamber cavities are therefore formed in the pumping chamber layer (e.g., the silicon layer 540).

In some implementations, it can be desirable to form the pumping chamber cavities according to the steps shown in FIGS. 5A-5D before the other structures in the actuation layers are fabricated, since the pumping chamber cavities can be used as a mask to guide the removal of materials from the underside of the curved piezoelectric membrane. The pumping chamber cavities can help improve the definition and alignment of the actuation portion (e.g., the curved portions of the piezoelectric membrane), and reduce the non-uniformity and unintended resonance effects in the printhead die.

FIGS. 6A-7K illustrate several example processes for forming a profile-transferring surface on which a curved piezoelectric layer can be deposited. The profile-transferring surface includes at least a curved portion surrounded by a planar portion. In most cases, the profile-transferring surface includes a plurality of curved portions surrounded by a planar portion, the location of each curved portion corresponds to the location of a pumping chamber cavity. The profile-transferring surface can be formed in a first side of a profile-transferring substrate, or in a first side of a layer of the profile-transferring substrate.

In the processes shown in FIGS. 6A-7K, the profile-transferring surface of the profile transferring substrate is formed after the pumping chamber cavities have been created (e.g., using the process shown in FIGS. 5A-5D). However, in some implementations, the process for forming the profile-transferring surface of the profile-transferring substrate can be performed before or at the same time as the pumping chamber cavities are formed.

In the following descriptions, FIGS. 6A-6D illustrate an example process for preparing a planar surface in a first side of a profile-transferring substrate before the curved portions are formed in the first side of the profile-transferring substrate. Starting from the planar surface, FIGS. 6E-6F then illustrate an example process for forming a concave surface surrounded by the planar surface in the first side of the profile-transferring substrate. FIGS. 6G-6I illustrate an example process for forming a convex surface surrounded by the planar surface in the first side of the profile-transferring substrate.

In addition to the processes shown in FIGS. 6E-6I, FIGS. 7A-7K illustrate another process in which a negative profile-transferring surface is first prepared in a negative profile-transferring substrate, and then the profile-transferring surface is made based on the negative profile-transferring surface. For example, FIGS. 7A-7D illustrate an example process for forming a negative profile-transferring substrate having a convex surface surrounded by a planar surface. FIGS. 7E-7K illustrate an example process for forming a concave surface surrounded by a planar surface on a profile-transferring substrate utilizing the negative profile-transferring substrate shown in FIG. 7D. Although a convex surface is used as the negative profile-transferring surface to make a concave profile-transferring surface in the example shown, the same principle applies to making a convex profile-transferring surface based on a concave negative profile-transferring surface. Profile-transferring surfaces having other kinds of surface features can be made by corresponding negative profile-transferring substrate in a similar manner.

Figure 6A:
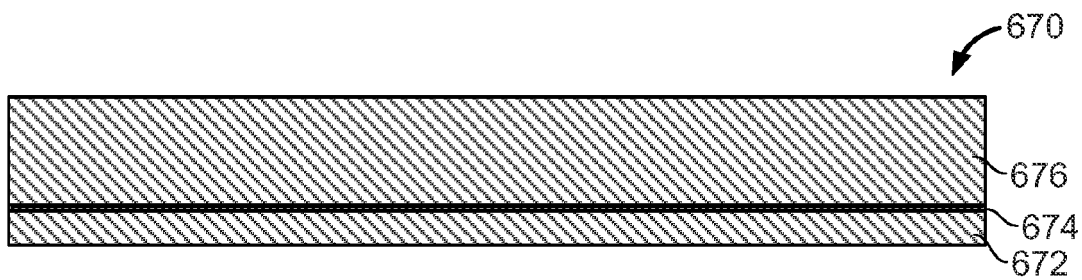
FIGS. 6A-6D illustrate an example process for preparing a planar surface on a profile-transferring substrate before the curved surface is formed on the profile-transferring substrate.
Figure 6A:
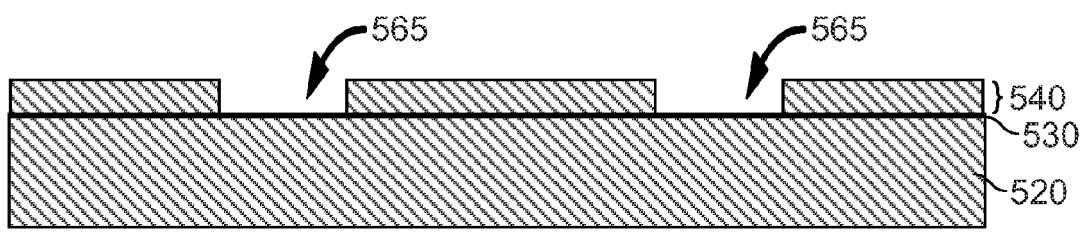

Referring to FIG. 6A, a second semiconductor wafer 670 (e.g., an SOI wafer) is disposed over the exposed surface of the silicon layer 540. The semiconductor wafer 670 includes a semiconductor layer 672 (e.g., a silicon layer), a handle layer 676, and an oxide layer 674 between the semiconductor layer 672 and the handle layer 676. The semiconductor layer 672 can serve as a profile-transferring substrate layer on which a profile-transferring surface can be formed. Metal and piezoelectric layers can be subsequently deposited on the profile-transferring surface of the profile-transferring substrate layer to form the reference electrode layer, the piezoelectric layer, and the drive electrode layer.

Figure 6B:
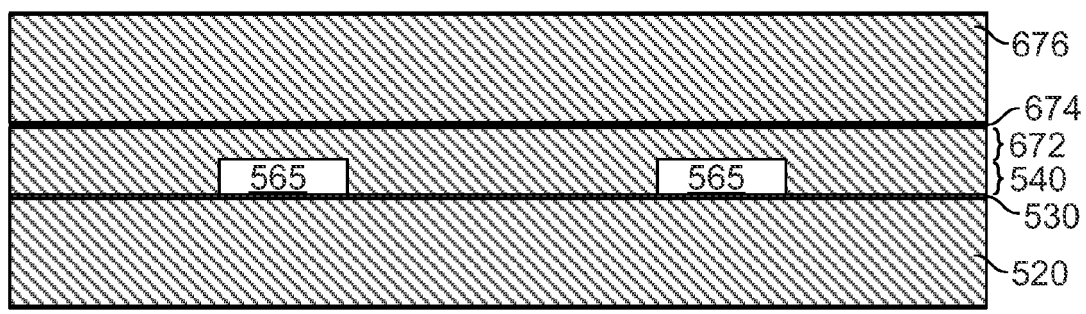

The exposed planar surface of the semiconductor layer 672 can be bonded to the exposed planar surface of the silicon layer 540. The bond can be a silicon-to-silicon fusion bond, for example. After the bonding, the recesses 565 in the silicon layer 540 is sealed from above by the previously exposed surface of the semiconductor layer 672, as shown in FIG. 6B.

While the layers in the SOI wafer 670 can have just about any thickness, the oxide layer 674 is thinner than the silicon layer 672 and the handle layer 676. In an exemplary SOI wafer 670, the oxide layer 674 is less than a few microns thick, such as about 1 micron thick. The handle layer 676 can have a thickness of greater than 200 microns, such as about 600 microns. The silicon layer 672 has the thickness of at least the final desired height of the curved piezoelectric membrane. For example, the silicon layer 672 can be about 12 microns thick or 10 microns thick. Other thicknesses are possible.

In some implementations, the silicon layer 672 can have a thickness greater than the desired height of the curved surface of the piezoelectric membrane, and a portion of the silicon layer 672 that fused with the silicon layer 540 eventually becomes part of the pumping chamber layer.

Figure 6C:
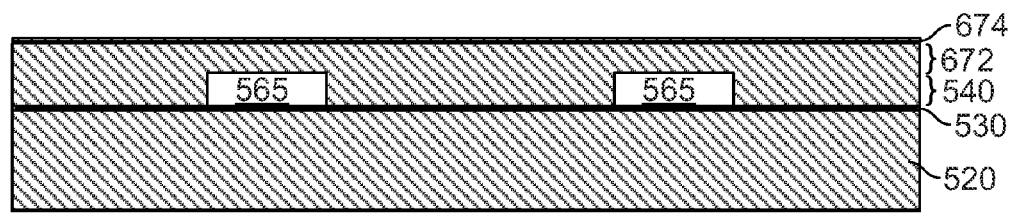
Figure 6D:
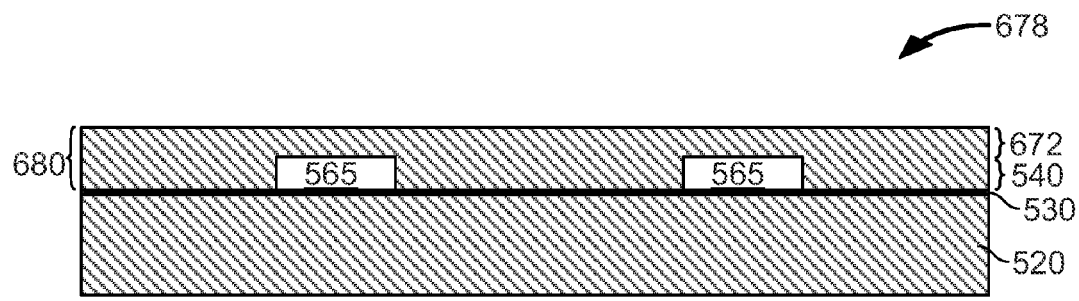

After the bonding between the two SOI wafers is completed, the handle layer 676 is removed to expose the oxide layer 674. The removal of the handle layer 676 can be accomplished by using various material removal methods, such as grinding and chemical mechanical polishing (CMP). The removal of the handler layer 676 can be finished by a KOH etching process until the oxide layer 674 is exposed, as shown in FIG. 6C. The oxide layer 674 is then striped, for example, by wet etching using a buffered hydrofluoric acid (BHF). After the oxide layer 674 is removed, a profile-transferring substrate 678 having sealed recesses 565 is produced, as shown in FIG. 6D.

The profile-transferring substrate 678 that resulted from the process shown in FIGS. 6A-6D includes a handle layer 520, a silicon layer 680, and an oxide layer 530 between the handle layer 520 and the silicon layer 680. The silicon layer 680 includes the sealed recesses 565, where the bottom of the recesses 565 is formed by a surface of the oxide layer 530, and the top of the recesses 565 is formed by a surface of the silicon layer 672 which is now bonded to the silicon layer 540.

Once the profile-transferring substrate 678 having an exposed planar surface has been prepared, subsequent processing can be performed to create a curved surface(s) on the exposed planar surface of the profile-transferring substrate 678. Other methods for preparing a planar surface in an exposed side of a profile-transferring substrate are possible.

Different processes can be used to form the curved profile-transferring surface of the profile-transferring substrate on which a curved piezoelectric actuator structure can be formed. The curved portion of the profile-transferring surface can have the same shape as the desired shape for the curved piezoelectric membrane. The curved portion of the profile-transferring surface can be a concave surface or a convex surface relative to the pumping chamber. The curved portion of the profile-transferring surface can be a symmetric section of a spheroid, ellipsoid, paraboloid, or any other surface that result from rotating a symmetric simple curve. In addition, the cross-sections of the curved surface along two orthogonal directions can be identical or different. In some implementations, only the cross-section along one of the two orthogonal axes of the curved surface is curved (e.g., as in a cylindrical half-shell).

Figure 6E:
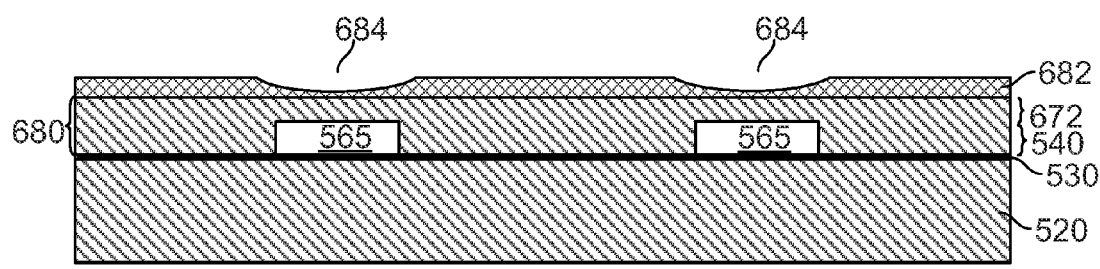
FIGS. 6E-6F illustrate an example process for forming a concave surface surrounded by a planar surface on the profile-transferring substrate (e.g., by using dents formed in a layer of photoresist by a grayscale mask).
Figure 6F:
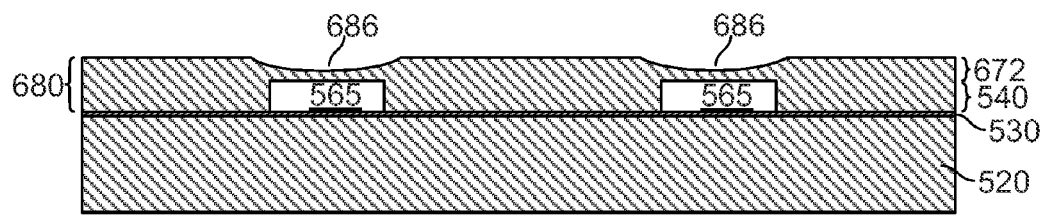
Figure 6G:
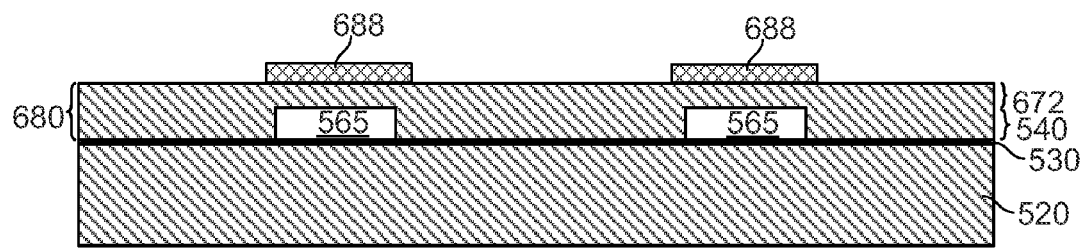
FIGS. 6G-6I illustrate an example process for forming a convex surface surrounded by a planar surface on the profile-transferring substrate (e.g., by using domes formed by heating and reflowing a layer of patterned photoresist on a substrate).
Figure 6H:
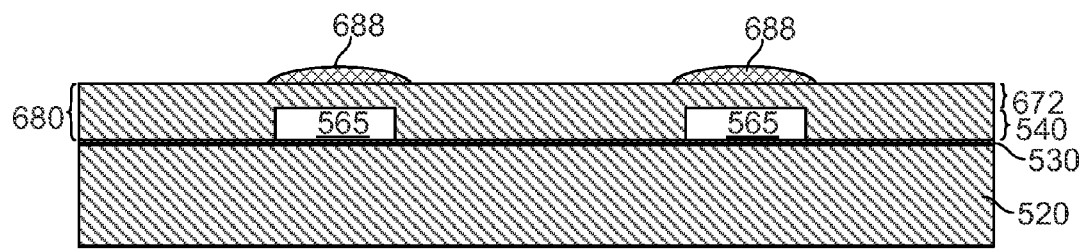
Figure 6I:
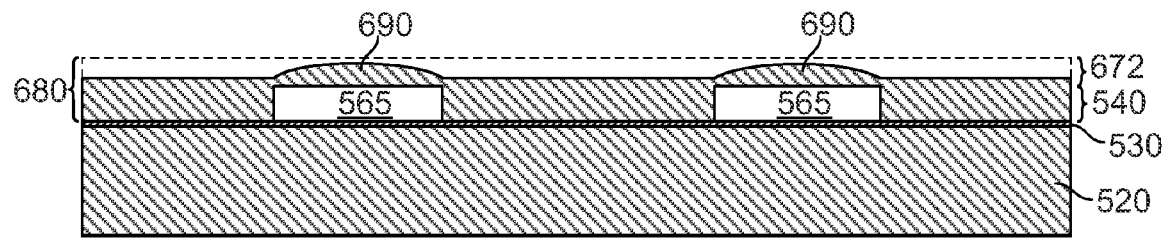

FIGS. 6E-6F illustrate an example process for forming a concave surface in the exposed side of a planar profile-transferring surface (e.g., the exposed surface of the silicon layer 672). Referring to FIG. 6E, the process can start with the substrate 678 resulted from the process shown in FIGS. 6A-6D. In some implementations, the process can start from another substrate that has an exposed silicon layer having a thickness of at least the desired height of the curved piezoelectric membrane. In some implementations, the recesses 565 for the pumping chambers do not need to have been formed at this point, and can be formed after the curved piezoelectric structures are formed over the profile-transferring substrate.

First, a photoresist layer 682 is deposited over the exposed side of the planar profile-transferring surface (e.g., the exposed surface of the silicon layer 672). The thickness of the photoresist layer 682 is at least the desired height for the curved surface of the piezoelectric membrane. A dent 684 having a concave surface can be created in the planar surface of the photoresist layer 682 above the area over each pumping chamber cavity 565.

In some implementations, the lateral dimensions of the dent 684 can be the same as the lateral dimensions of the pumping chamber cavity 565. In some implementations, the dent 684 in the photoresist layer 682 can extend beyond the area defined by the edge of the pumping chamber cavity 565. By extending the area of the dent 684 beyond the edge of the pumping chamber cavity 565, the curved portion(s) of the profile-transferring surface and hence the curved portion(s) of the piezoelectric membrane subsequently deposited on the surface of the dent 684 can be made to extend beyond the edge of the pumping chamber as well. As set forth above, such a design would help to prevent breakage of the piezoelectric membrane during actuation.

The amount of extension beyond the pumping chamber edge can vary depending on the dimensions of the pumping chamber cross-sectional area. In some implementations, the radius of the dent can be 2-20 microns (e.g., 10 microns) greater than the radius of the pumping chamber. In some implementations, the extension can be less than 10 microns (e.g., 5-10 microns). In some implementations, the amount of extension beyond the pumping chamber edge can be selected based on the angle between the curved portion of the piezoelectric membrane and the flat portion of the piezoelectric membrane, and/or the thickness of the piezoelectric membrane. In some implementations, the angle between the curved portion of the piezoelectric membrane and the flat portion of the piezoelectric membrane can be about 5-15 degrees (e.g., 6 degrees or 8 degrees).

In some implementations, the dents 684 in the photoresist layer 682 can be created using a grayscale photomask. A grayscale photomask have pixilated features that modulate the intensity of UV light used in the standard photoresist exposure process. This intensity modulation results in locally varied photoresist exposure and correspondingly varied depth/thickness upon wet chemical development. After the photoresist layer is developed, the photoresist and the underlying substrate can be exposed to an etching process (e.g., using deep reactive ion etching or other dry etching techniques), the varied depth/thickness in the photoresist layer can be transferred to the underlying substrate, with possible alteration, based on the etch selectivity to the silicon versus the photoresist.

To form the dent 684 on the planar surface of the photoresist layer 682, a grayscale photomask that allows a decreasing amount of UV light exposure to the photoresist with an increasing distance from the center of the yet-to-be-formed dent 684 can be used. The amount of UV light exposure can be reduced to zero beyond the desired radius of the dent 684, such that the surface of the photoresist layer 682 surrounding the dent 684 can remain substantially planar after development.

For a given dent shape, a desired amount of UV light exposure can be calculated for each pixel on the dent surface, and the grayscale photomask having the calculated pixel values can be created. The grayscale photomask is used to filter the UV light shone on the planar surface of the photoresist layer 682 for a predetermined duration. When the photoresist layer 682 is developed, a dent 684 having the desired shape can be formed in the planar surface of the photoresist layer 682. The location of the dent 682 can be chosen such that it is situated directly over the area where the pumping chamber cavity has been or would be formed in the silicon layer 540.

Once the photoresist layer 682 having dents 684 over the area of the pumping chamber cavities 565 are formed, an etchant can be applied to the exposed surface of the photoresist layer 682. The etchant can be prepared such that it has a 1:1 selectivity to the photoresist layer 682 versus the silicon layer 672. As the etching continues, the photoresist inside the dents 684 is etched away first. While the photoresist layer 682 outside of the dents 684 continues to be etched away, the etchant also etches away portions of the silicon layer 672 inside the dents 684.

For this process, an isotropic etchant is used, so that the resulting dents 686 in the planar surface of the silicon layer 672 (as shown in FIG. 6F) resemble the dents 684 in the planar surface of the photoresist layer 682 before the etchant was applied (as shown in FIG. 6E). In some implementations, the shape of the dents 686 in the surface of the silicon layer 672 can be made slightly different from the shape of the dents 684 in the surface of the photoresist layer 682 by slightly varying the selectivity of the etchant from 1:1 between the photoresist and the silicon.

The etching can be stopped once the photoresist layer 682 has been removed completely, and the shapes of the dents 684 have been transferred to the surface of the silicon layer 672. In some implementations, the planar portion of the resulting surface can be rougher than the curved portions because the etch rate tends to be slightly less uniform on wide open areas of the photoresist layer. In some implementations, the profile of each dent in the photoresist layer can be made deeper than the desired profile of the dents in the profile-transferring surface (e.g., by a few microns). The etching can be allowed to continue until all of the photoresist layer is removed, such that the deep dents in the photoresist layer are completely transferred onto the now exposed surface of the silicon layer. Then, the exposed surface of the silicon layer can be polished to remove the roughness on the planar portion, and until the desired depth of the dents in the profile-transferring surface is reached.

In some implementations, the dents in the photoresist layer can be made slightly larger and/or deeper than the desired shape of the dents in the profile-transferring surface. The etching can be allowed to continue until the desired shape of the dents has been created in the silicon layer and while there is still a thin layer of photoresist remaining on the silicon layer and surrounding the dents in the silicon layer. The remaining photoresist layer is then removed. Since the planar portion of the resulting surface of the silicon layer was never exposed to etching, the planar portion retains a level of smoothness it had before the photoresist layer was applied, and no further polishing of the planar portion would be required.

As shown in FIG. 6F, the resulting structure has a silicon layer 680, a handle layer 520, and an oxide layer 530 between the silicon layer 680 and the handle layer 520. The exposed surface of the silicon layer 680 includes curved portions 686 over the areas of the pumping chamber cavities 565 (either already formed in the silicon layer 680 or will be formed later in the silicon layer 680), and a substantially planar portion surrounding the curved portions. The resulting structure shown in FIG. 6F can be used as a profile-transferring substrate to form a piezoelectric structure having a concave piezoelectric membrane relative to the pumping chamber.

Alternative to the process shown in FIGS. 6E-6F, FIGS. 6G-6I illustrate an exemplary process for preparing a profile-transferring substrate having convex surface relative to the pumping chamber.

Referring to FIG. 6G, the process can start with a planar profile-transferring surface (e.g., the exposed planar surface of the substrate 678 resulted from the process shown in FIGS. 6A-6D). In some implementations, the process can start from a substrate having an exposed silicon layer 672 that has a thickness of at least the desired height for the curved surface of the piezoelectric membrane (e.g., 12 microns). In some implementations, the substrate include a pumping chamber layer, where the pumping chamber cavities are either already formed or can be formed after the curved piezoelectric membrane is formed.

First, a photoresist layer 688 is deposited over the exposed surface of the silicon layer 672. The thickness of the photoresist layer 688 is at least the desired height for the curved surface of the piezoelectric membrane (e.g., 12 microns). A standard photomask can be used to pattern the photoresist layer 688 such that only portions of the photoresist layer 688 directly above the areas of the pumping chambers are shielded from UV light exposure. Once the photoresist layer 688 is developed, only the portions of the photoresist layer 688 directly above the areas of the pumping chamber cavities remain on the top surface of the silicon layer 672.

In some implementations, the portions of the photoresist layer 688 that remain on the silicon layer 672 can extend beyond the areas defined by the edges of the pumping chambers. The amount of extension beyond the pumping chamber edge can vary depending on the size of the pumping chamber cross-sectional area, the desired height of the curved piezoelectric membrane, and/or the thickness of the piezoelectric membrane. In some implementations, the radius of each of the remaining portions of the photoresist layer 688 can be 10-20 microns (e.g., 10 microns) larger than the radius of the pumping chamber. In some implementations, the extension beyond the pumping chamber walls can be less than 10 microns (e.g., 2-5 microns).

Referring to FIG. 6H, the remaining photoresist 688 on the silicon layer 672 is heated (e.g., to about 250 degrees Celsius) such that the remaining photoresist 688 melts and reflows to form a dome due to the surface tension of the liquefied photoresist. When the photoresist 688 is then cooled (e.g., to room temperature), the domes solidify and retain their domed shapes. As a result, domes of photoresist 688 are formed on the planar surface of the silicon layer 672 directly above the areas where the pumping chamber cavities are or would be formed in the pumping chamber layer 540. In some implementations, each dome of photoresist 688 extends beyond the edge of a corresponding pumping chamber below the dome 688. The amount of extension can be 2-5 microns, or 5-10 microns, for example.

Once the solidified domes of photoresist 688 are formed on the planar surface of the silicon layer 672, an etchant can be applied to the exposed surface of the photoresist 688 and the exposed surface of the silicon layer 672. The etchant can be prepared such that it has a 1:1 selectivity to the photoresist 688 and the silicon layer 672. As the etching continues, the photoresist layer 688 and the exposed silicon layer 672 are etched away at the same rate.

For this process, an isotropic etchant is used, so that the resulting domes 690 (shown in FIG. 6I) in the exposed surface of the silicon layer 672 resembles the shape of the domed surface in the photoresist layer 688 before the etchant is applied (as shown in FIG. 6H). The etching is stopped once all of the photoresist 688 has been removed, and the domed shape is transferred to the exposed surface of the silicon layer 672, as shown in FIG. 6I. In some implementations, the selectivity of the etchant can be varied slightly such that the resulting domed surface in the silicon layer 672 is altered slightly from the domed surface of the photoresist 688.

As shown in FIG. 6I, the resulting structure has a silicon layer 680, a handle layer 520, and an oxide layer 530 between the silicon layer 680 and the handle layer 520. The exposed surface of the silicon layer 680 includes curved portions 690 over the areas of the pumping chamber cavities 565 (either already formed in the silicon layer 680 or will be formed later in the silicon layer 680), and a substantially planar portion surrounding the curved portions. The resulting structure shown in FIG. 6I can be used as a profile-transferring substrate to form a piezoelectric structure having a convex piezoelectric membrane relative to the pumping chamber.

Figure 6J:
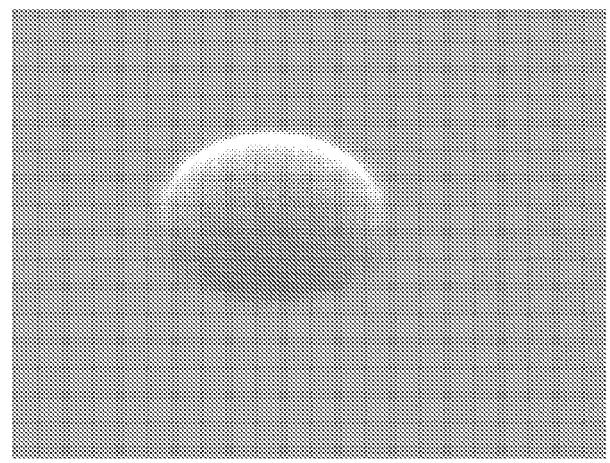
FIG. 6J illustrates a convex surface of a silicon profile-transferring substrate made using a photoresist dome formed by heating and reflowing the photoresist in a non-vacuum environment.

The photoresist heating and reflowing process can be performed in a non-vacuum environment. However, when the domes of the photoresist and underlying substrate are etched away such that the curved surface of the photoresist domes are transferred to the exposed surface of the underlying substrate, the resulting surface of the silicon substrate can sometimes include unintended defects and voids. For example, FIG. 6J shows a Scanning Electron Microscope (SEM) image of a silicon dome formed by the process shown in FIGS. 6G-6I, where the photoresist was heated and reflown in a non-vacuum environment (e.g., under the atmospheric pressure). The surface of the silicon dome shown in FIG. 6J have a surface roughness of about 15-20 angstroms.

Figure 6K:
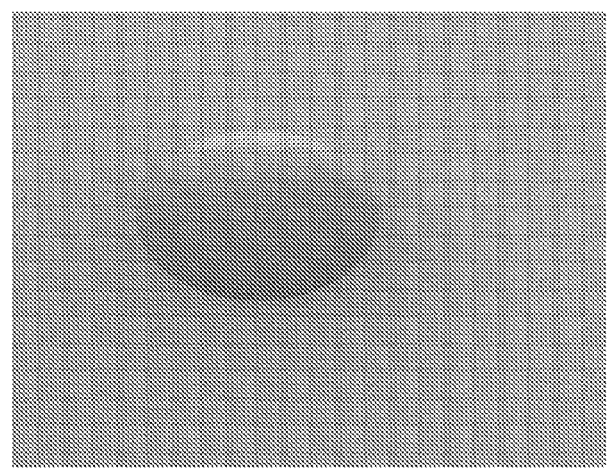
FIG. 6K illustrates a convex surface of a silicon profile-transferring substrate made using a photoresist dome formed by heating and reflowing the photoresist in a vacuum environment.

Alternatively, the photoresist heating and reflowing process can be performed in a vacuum environment. Without being limited to any particular theories, the surface roughness of the resulting silicon dome can be reduced substantially. In some implementations, the cooling of the photoresist can be performed in a vacuum environment as well. FIG. 6K shows a Scanning Electron Microscope (SEM) image of a silicon dome formed by the process shown in FIGS. 6G-6I, where the photoresist was heated and reflown in a vacuum environment. The surface of the silicon dome shown in FIG. 6K is substantially smoother as compared to the silicon dome shown in FIG. 6J.

The silicon dome formed on the planar substrate can be used as a profile-transferring surface on which a piezoelectric material can be deposited, or a negative profile-transferring surface based on which a profile-transferring surface can be formed. The smoother substrate surface resulted from the vacuum photoresist heating and reflowing process allows the materials subsequently deposited thereon to have a smoother surface as well. The process for heating and reflowing photoresist in a vacuum environment can be applied to other applications where smooth curved surfaces formed on a substrate are desirable, such as in microlens fabrication processes.

FIGS. 7A-7K illustrate another process in which a negative profile-transferring surface is first prepared in a negative profile-transferring substrate, and then the profile-transferring surface is made based on the negative profile-transferring surface. For example, FIGS. 7A-7D illustrate an example process for forming a negative profile-transferring substrate having a convex surface surrounded by a planar surface. The process for forming the convex surface of the negative profile-transferring substrate is similar to the process for making a convex profile-transferring surface shown in FIGS. 6G-6I.

Figure 7A:
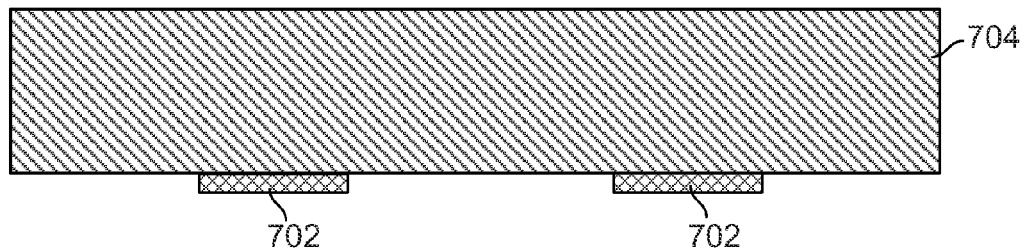
FIGS. 7A-7D illustrate an example process for forming a negative profile-transferring substrate having a curved surface surrounded by a planar surface.

Referring to FIG. 7A, a patterned photoresist layer 702 is deposited on a semiconductor substrate layer 704, such as a silicon substrate. The patterned photoresist layer 702 covers areas that would be vertically aligned with the pumping chamber cavity from above. The portions of the substrate surface that are covered by the remaining photoresist 702 can extend slightly beyond (e.g., by 2-5, 5-10, or 10-20 microns) the lateral cross-sectional areas of the pumping chamber cavities. The thickness of the photoresist layer 702 is approximately the desired height for the curved surface of the piezoelectric membrane.

Figure 7B:
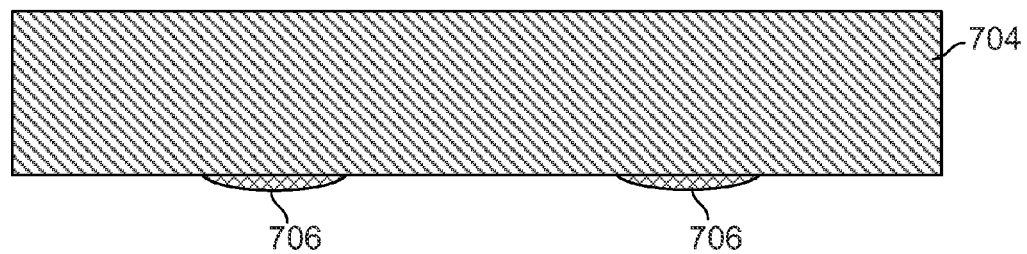

Referring to FIG. 7B, the photoresist 702 is heated such that the photoresist melts and reflow to form domes of photoresist 706 on the exposed surface of the substrate layer 704. The photoresist is then cooled such that the domes solidify and remain on the exposed surface of the substrate layer 704. In some implementations, the photoresist 702 is heated and reflown in a vacuum environment to about 250° C. In some implementations, the photoresist is cooled in a vacuum environment as well.

Figure 7C:
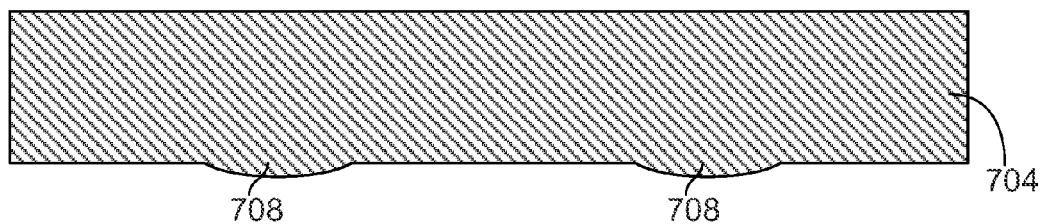

Then, the exposed surface of the substrate layer 704 including the domes of photoresist 706 is exposed to an etchant having a 1:1 selectivity to the substrate material versus the photoresist. The photoresist and the substrate are etched away at the same rate. The etching is stopped when all of the photoresist 706 has been removed, and the domed shape of the photoresist 706 has been transferred to the exposed surface of the silicon layer 704, as shown in FIG. 7C. The domed surfaces 708 are surrounded by a planar surface. The convex domes 708 are a negative of the desired concave profile-transferring surfaces, and can be used to form the profile-transferring surface in a profile-transferring substrate.

Figure 7D:
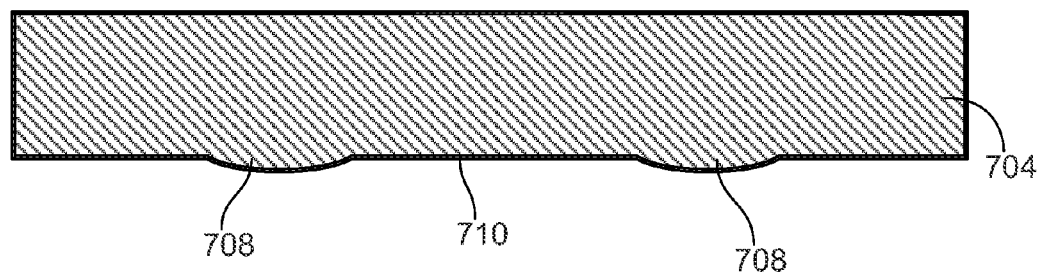

Referring to FIG. 7D, an etch stop layer (e.g., oxide layer 710) is deposited over the surface of the substrate 704, for example, through thermal oxidation. The thickness of the oxide layer 710 can be a few microns, such as 1-2 microns. The oxide layer 710 uniformly covers the side of the substrate 704 that contains the domed surfaces 708. In some implementations, the oxide layer 710 can also cover the substrate 704 on other sides that do not contain the domed surfaces. In some implementations, other kinds of materials (e.g., silicon nitride) can be deposited on the substrate surface and used as the etch stop layer. In some implementations, the etch stop layer only needs to cover the curved portions of the substrate surface. At this point, the negative profile-transferring surface having a convex portion surrounded by a planar portion is created in an exposed side a negative profile-transferring substrate, as shown in FIG. 7D.

FIGS. 7E-7K illustrate an example process for forming a concave surface surrounded by a planar surface in a profile-transferring substrate utilizing the negative profile-transferring substrate shown in FIG. 7D. In some implementations, the same-shaped negative profile-transferring substrate produced using other methods (e.g., by grinding or injection molding) can be used as well.

Figure 7E:
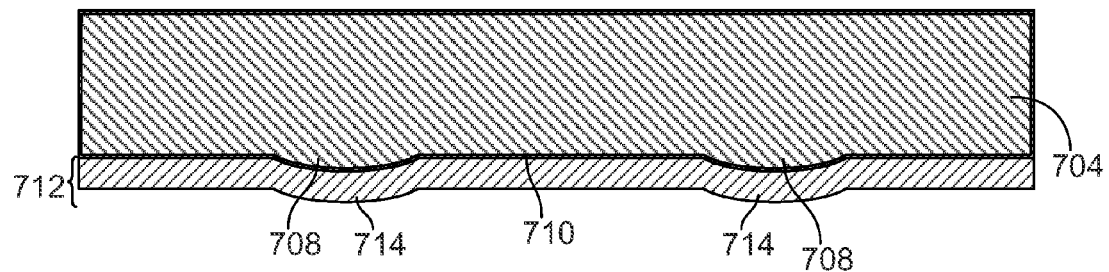
FIGS. 7E-7K illustrate an example process for forming a curved surface surrounded by a planar surface on a profile-transferring substrate utilizing the negative profile-transferring substrate shown in FIG. 7D.

Referring to FIG. 7E, a layer of polysilicon 712 can be uniformed deposited on the surface of the substrate 704 that contains the domes 708. The polysilicon layer 712 can have any thickness but is at least as thick as the height of the domes 708 on the substrate 702. Therefore, the exposed surface of the polysilicon layer 712 has curved portions 714 surrounded by a planar portion, and at the same time, the unexposed surface of the polysilicon layer 708 (i.e. the surface that interfaces with the substrate 702) has the same curved portions 714 surrounded by a planar portion.

In some implementations, a deposition of the polysilicon layer can be performed in two steps. First, a thin layer (e.g., about 0.25 microns) of polysilicon is deposited at 950° C. for the nucleation of the polysilicon on the negative-profile transferring substrate. Then, the thicker layer (e.g., about 22 microns) of polysilicon is deposited at a higher temperature (e.g., 1150° C.). The deposition rate can be about 1 micron/minute, for example. In some implementations, materials other than polysilicon may be used, such as various polymers and other semiconductor materials.

Figure 7F:
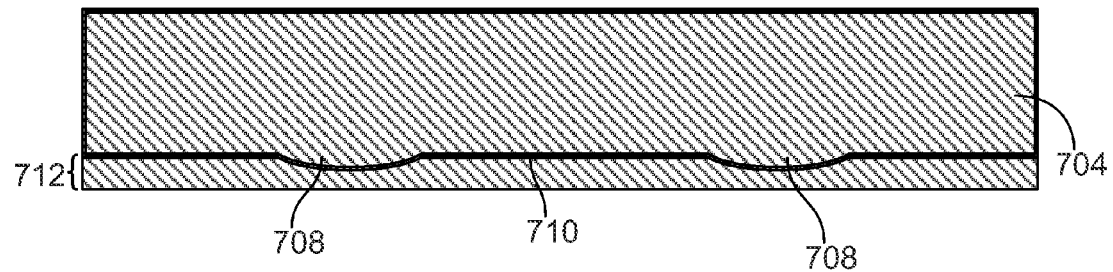

Referring to FIG. 7F, the polysilicon layer 712 is then polished and planarized such that the curved portions 714 on the exposed surface of the polysilicon layer 712 are removed, and the exposed surface of the polysilicon layer 712 becomes planar, while the unexposed surface of the polysilicon layer 712 remains interfaced with the oxide layer 710 and has curved portions that match the domed surfaces of the oxide layer 710. In some implementations, the polysilicon layer is annealed at a high temperature (e.g., 1100° C.) in a nitrogen environment for a period of time (e.g., 1 hour) before the planarization is started.

Figure 7G:
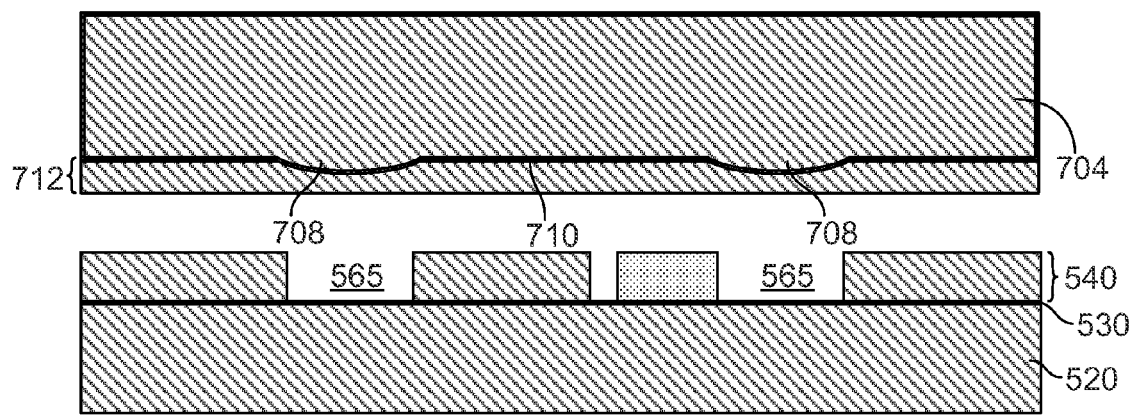

Referring to FIG. 7G, the resulting structure shown in FIG. 7F can then be bonded to a substrate containing a pumping chamber layer (e.g., the structure resulted from the process illustrated in FIGS. 5A-5D). In some implementations, portions of the oxide layer 530 inside the pumping chamber cavity 565 have a smaller thickness than other portions of the oxide layer 530 underneath the pumping chamber layer 540 (e.g., 0.5 micron versus 1 micron). The exposed planar surface of the polysilicon layer 712 is bonded to the exposed surface of the pumping chamber layer 540. In some implementations, the polished polysilicon layer 712 is cleaned (e.g., by RCA cleaning) before it is bonded to the substrate containing the pumping chamber. The cleaning removes debris and particles on the polysilicon domes and reduces voids in the bonding interface. Each of the curved portions 708 in the surface of the substrate 702 are aligned with a corresponding pumping chamber cavity 565. In some implementations, the edge of each curved portion 708 extends slightly beyond the edge of the corresponding pumping chamber cavity 565 (e.g., by 2-5 microns or by 5-10 microns).

Figure 7H:
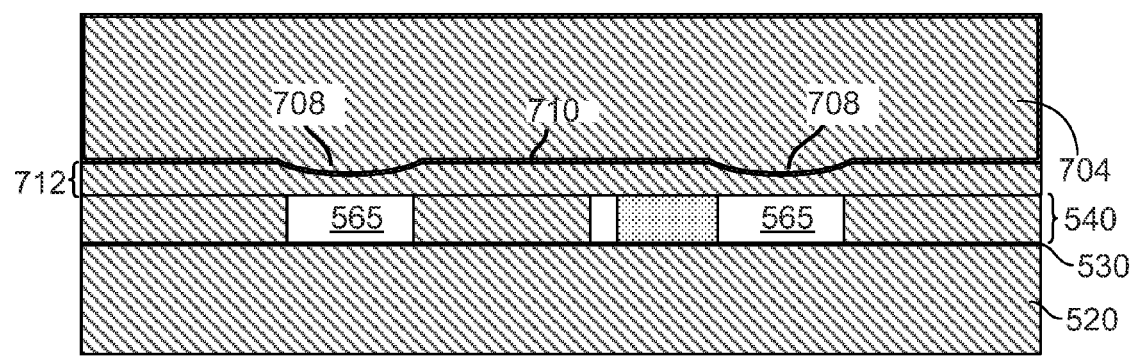
Figure 7I:
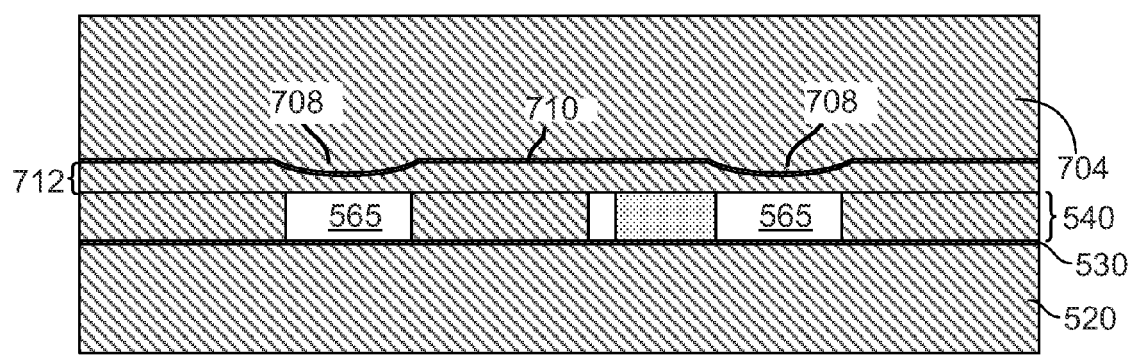

After the bonding between the polysilicon layer 712 and the pumping chamber layer 540 is completed, the pumping chamber cavities 565 become sealed from above by the planar surface of the polysilicon layer 712, as shown in FIG. 7H. Then, the oxide layer 710 is stripped from the exposed surfaces of the substrate 704 (if all sides of the substrate 704 were oxidized), such that the substrate 704 is exposed from the sides that do not include the curved portions 708 (as shown in FIG. 7I).

Figure 7J:
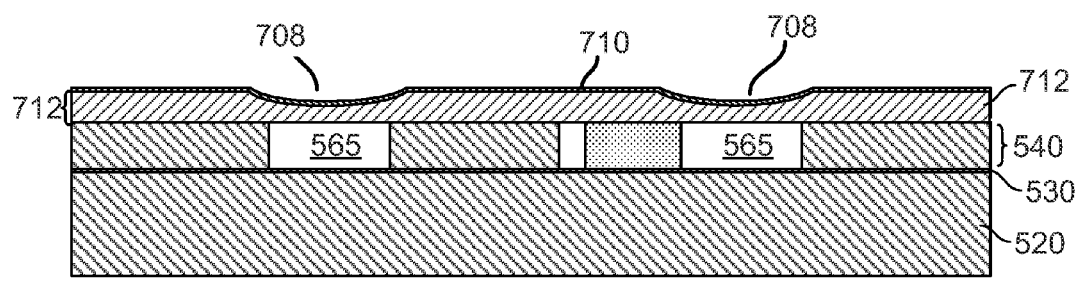

Referring to FIG. 7J, the substrate 704 is removed by various chemical, mechanical, or combined bulk removal techniques, and optionally finished by a KOH etching process, until the oxide layer 710 is completely exposed. The oxide layer 710 is uniform in thickness, therefore, the same curved portions exist in both sides of the oxide layer 710. When the substrate 704 is removed, the now exposed surface of the oxide layer 710 also has the curved portions 708 surrounded by a planar portion. The curved portions of the exposed surface of the oxide layer 710 are concave relative to the pumping chamber cavities. The surface of the polysilicon layer 712 adjacent to the oxide layer 710 has the same concave portions matching the concave portions 708 of the oxide layer 710.

Figure 7K:
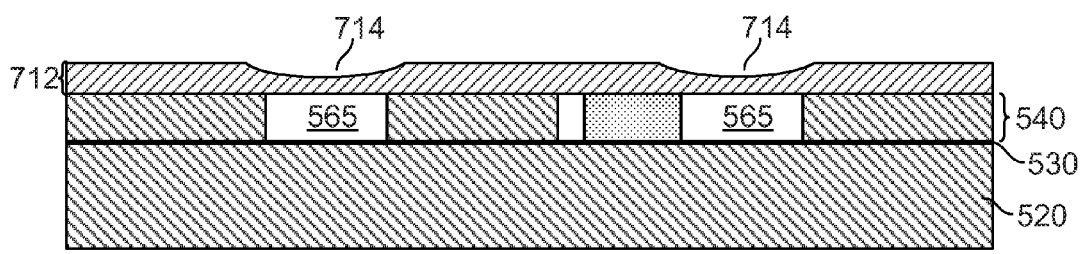

Optionally, the oxide layer 710 is stripped away, for example, by etching, and the surface of the polysilicon layer 712 adjacent to the oxide layer 710 is exposed. The now exposed surface of the polysilicon layer 712 have concave portions 714 surrounded by a planar portion. The now exposed surface of the polysilicon layer 712 as shown in FIG. 7K can be used as the profile-transferring surface for making a piezoelectric actuator having a curved piezoelectric membrane. A new etch stop layer (e.g., an oxide layer or a metal layer) can be applied on the exposed surface of the polysilicon layer 712 when making the piezoelectric structure, if the oxide layer 710 has been removed.

Figure 7L:
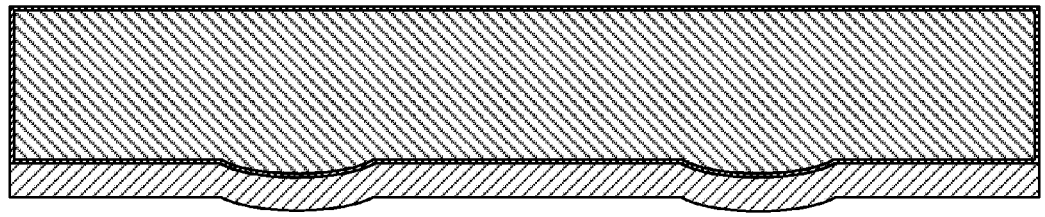
FIGS. 7L-7N illustrate an example process for polishing a polysilicon layer deposited on the negative profile-transferring substrate shown in FIG. 7D and a polished surface resulting from the process.
Figure 7M:
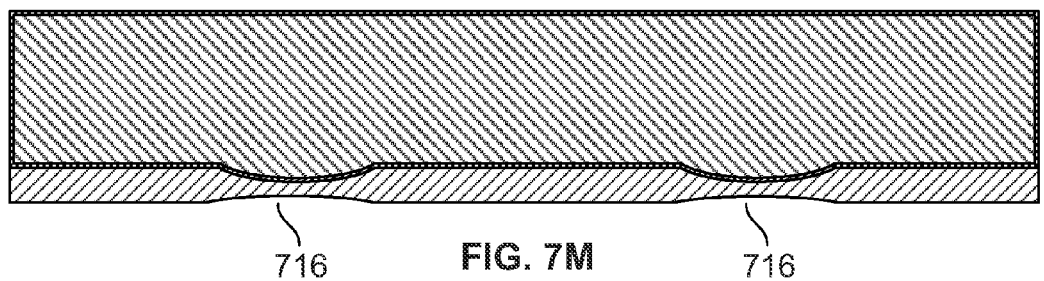

In the process shown in FIGS. 7E-7K, if the planarization and polishing of the domed polysilicon layer is done without first annealing the polysilicon layer at a high temperature, non-uniformity may occur on the polished polysilicon substrate. For example, FIGS. 7L-7M shows an example process of removing the polysilicon dome from the polysilicon layer without first annealing the polysilicon layer. The polishing of the polysilicon layer can be performed using a standard silicon polishing slurry, for example. FIG. 7L shows the polysilicon layer before the dome removal is started. FIG. 7M shows the polysilicon layer after the polishing has started and a portion of the silicon dome has been removed. Although the surface roughness of the polysilicon layer is not high (e.g., about 20 angstroms) and acceptable for bonding, the area over the polysilicon dome exhibits non-uniformity in polishing rates, which has resulted in dishing of the polished surface above the dome area. As shown in FIG. 7M, the areas of the polysilicon surface over the polysilicon domes (now substantially removed) are slightly dented in the center (e.g., as dents 716).

Figure 7N:
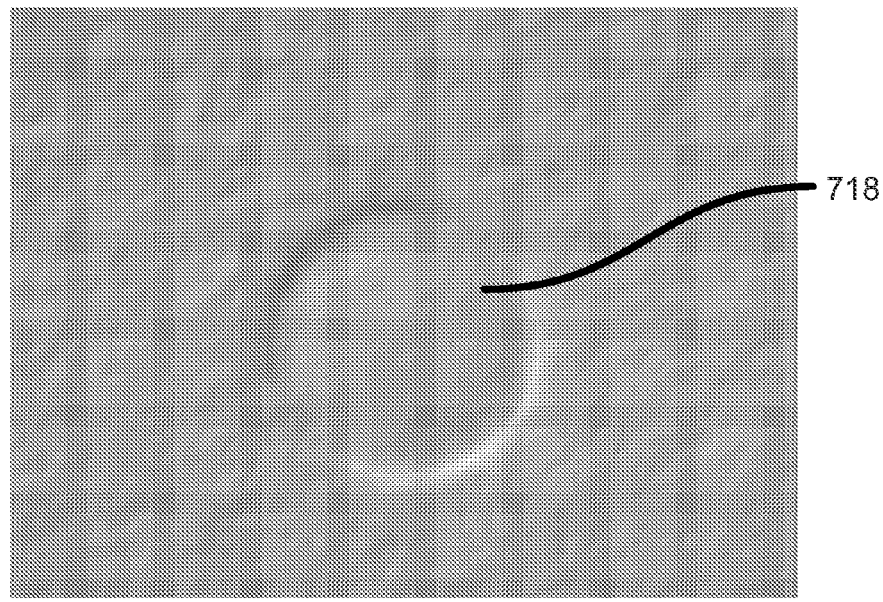

FIG. 7N shows an image of a polysilicon dome which has resulted from the process shown in FIGS. 7L-7M. The planar region has a slower polishing rate as compared to the area of the polysilicon dome, and dishing has occurred in the central region 718 of the polysilicon dome area. The dishing can be as large as 1000 angstroms, which may cause bonding failure at the dome area.

Figure 7O:
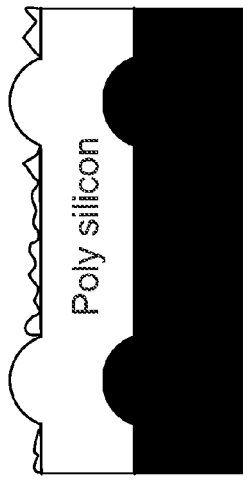
FIGS. 7O-7S illustrate another example process for polishing a polysilicon layer deposited on the negative profile-transferring surface shown in FIG. 7D and polished surfaces resulted from the process.
Figure 7P:
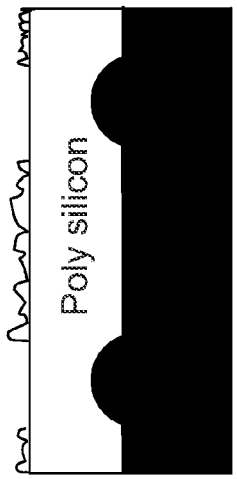
Figure 7Q:
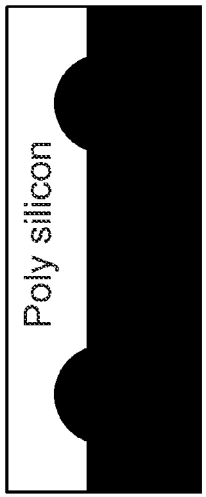

FIGS. 7O-7Q illustrate another process for planarizing and polishing the domed polysilicon layer before bonding it to a substrate. In the process shown in FIGS. 7A-7Q, the polysilicon layer is first annealed at a high temperature (e.g., 1100° C.) in a nitrogen environment. In some implementations, other inert gas environment can be used as well. In addition, the polishing can be performed in two steps, first using a standard low pH silicon slurry, and then using a high pH oxide slurry.

Figure 7R:
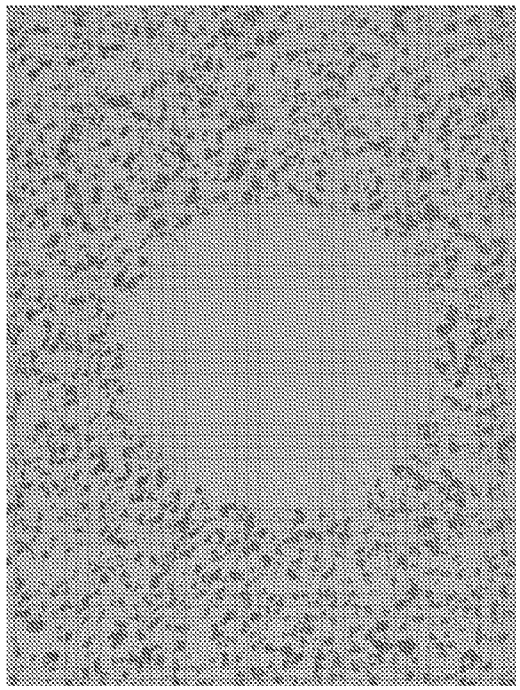
Figure 7S:
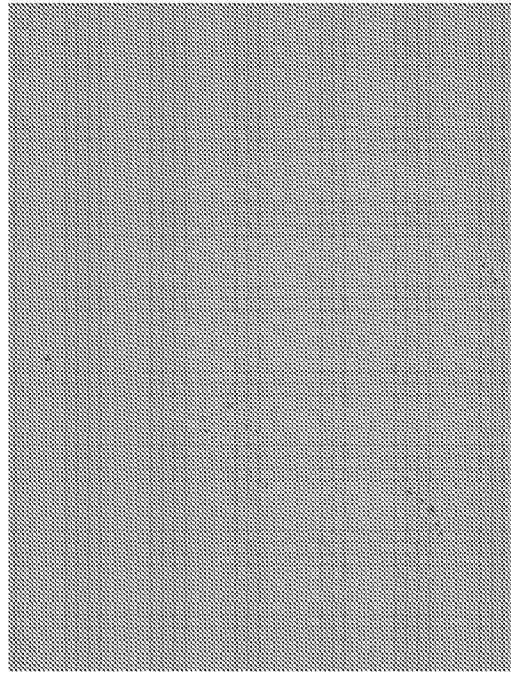

FIG. 7O illustrate the domed polysilicon layer after the annealing process. First, the domes are removed by polishing (e.g., CMP or other mechanical polishing processes) using a low pH silicon slurry, and the resulting surface structure is shown in FIG. 7P. FIG. 7R shows the surface of the polysilicon layer after polishing by the low pH silicon slurry. The dome is removed, and the original domed area becomes planar. The surface roughness in the original domed area is low, while the surface roughness of the original planar area remains high, as shown in FIG. 7R. In order to achieve uniform smoothness across the entire surface of the polysilicon layer, an additional polishing step can be carried out. As shown in FIG. 7P, the surface roughness of the polysilicon layer is further removed by polishing the polysilion surface using a high pH oxide slurry, resulting in the structure shown in FIG. 7Q. The polishing can be stopped when the desired surface smoothness is reached (e.g., after 3 microns of polysilicon has been removed). FIG. 7S shows the surface of the polysilicon layer after polishing by the high pH oxide slurry.

As shown in FIG. 7S, the entire surface of the polished polysilicon layer is uniform and smooth, and no dishing has occurred in the surface. The total thickness variation in the polysilicon surface can be very small (e.g., less than 1 micron), and the average thickness of the polysilicon layer after polishing can be approximately 20-25 microns, for example.

Without limiting to any particular theory, the additional of the annealing step before the polishing is started can help to improve the surface flatness and smoothness of the planarized polysilicon layer. The smooth and flat polysilicon surface enables good bonding between the polysilicon layer and the substrate layer.

In addition, the annealing process likely have changed the grain size and chemical composition of the polysilicon layer, and made them more uniform across different regions in the polysilicon layer. The polishing rate in the planar portion of the polysilicon layer using the low pH silicon slurry is reduced as compared to the domed portions. However, after the domes are removed, the entire surface of the polysilicon layer can be polished using the high pH slurry at a high polishing rate.

Other methods of creating a surface having curved portions that are aligned with the pumping chambers can be used. For example, the dents or domes of the profile-transferring surface can be formed by grinding a planar surface of a substrate. Alternatively, the dents or domes can be formed by injection molding using a substrate material (e.g., Si powder with epoxy).

After the profile-transferring substrate having the desired profile-transferring surface has been prepared, the piezoelectric actuator can be formed on top of the profile-transferring surface. In some implementations, the profile-transferring surface can be formed on a substrate layer that includes the pumping chamber layer. In some implementations, the pumping chambers can be already formed when the profile-transferring surface is prepared, or can be formed after the profile-transferring surface has been prepared.

As illustrated in FIGS. 6E-6F, FIGS. 6G-6I, and FIGS. 7A-7K, the profile-transferring surface can include either convex portions surrounded by a planar portion, or concave portions surrounded by a planar portion. The positions of the curved portions (either concave or convex relative to the pumping chambers) are aligned with the pumping chamber cavities in the vertical direction. In addition, in some implementations, each of the curved portions of the profile-transferring surface extends beyond the edge of a corresponding pumping chamber, for example, by a few microns.

FIGS. 8A-8K illustrate an example process for forming the fluid ejection unit have a curved piezoelectric actuator. The process can start from the structure resulted from the process shown in FIGS. 6E-6F, or alternatively, from the process shown in FIGS. 6G-6I. Although FIGS. 8A-8K show a starting structure having a convex profile-transferring surface (i.e., the curved portion of the profile-transferring surface is convex relative to the pumping chamber cavity), the same process is equally applicable to a starting structure having a concave profile-transferring surface (e.g., the structure shown in FIG. 6F). Similarly, FIGS. 9A-9K illustrate another example process for forming a fluid ejection unit having a curved piezoelectric actuator. The process can start from the structure resulted from the process shown in FIGS. 7A-7K.

Figure 8A:
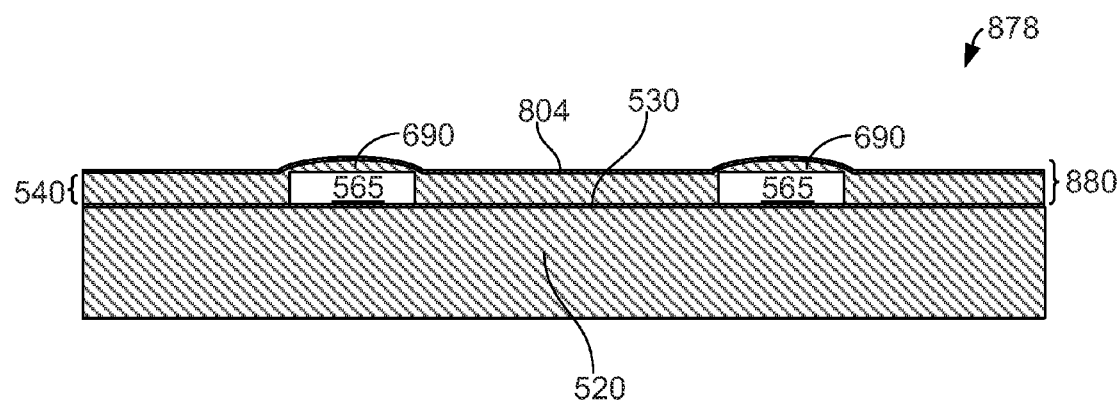
FIGS. 8A-8K illustrate an example process for forming a fluid ejection module based on a profile-transferring substrate (e.g., a profile-transferring substrate having a convex surface relative to the pumping chamber layer).

Now, referring to FIG. 8A, a substrate 878 includes a profile-transferring layer 880, a handle layer 520, and an oxide layer 530 between the profile-transferring layer 880 and the handle layer 520. The profile-transferring layer 880 includes a pumping chamber layer 540. The pumping chamber layer 540 has sealed recesses 565 formed therein. The top surface of the recesses 565 is below the curved portions 690 in the exposed surface of the profile-transferring layer 880. The bottom surface of the recesses 565 is formed by the oxide layer 530.

An etch stop layer 804 is deposited over the exposed surface of the profile transferring layer 880. The etch stop layer 804 can be a thin oxide layer formed by thermal oxidation. The thickness of the etch stop layer 804 can be approximately 0.25 microns. After the component layers of the piezoelectric actuator are subsequently deposited over the etch stop layer 804, the etch stop layer 804 acts to prevent the etching into the piezoelectric structure when portions of the profile-transferring layer within the edge of the pumping chamber cavities are later removed.

The etch stop layer 804 can also help smooth out the rough surface of the profile transferring layer 880. The etch stop layer 804 can also serve the function of protecting the piezoelectric actuator structure from the fluid in the pumping chambers during fluid ejection use. In some implementations, the etch stop layer 804 can be optional, for example, when the reference electrode layer can act as the etch stop layer and can withstand being in contact with the fluid inside the pumping chamber during operation.

Figure 8B:
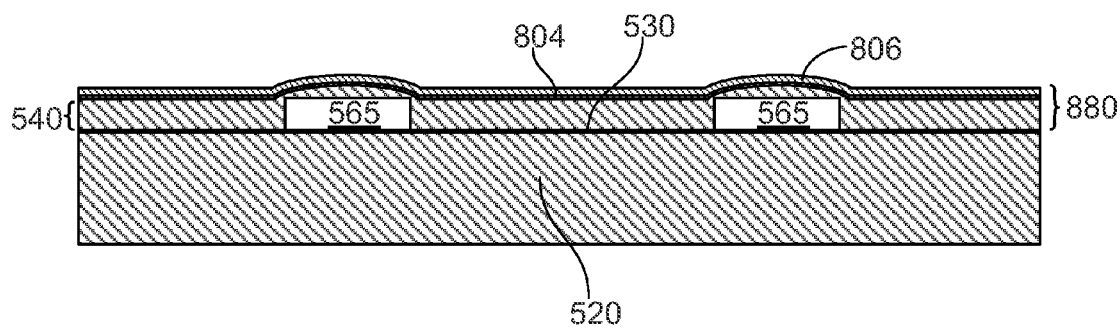

Referring to FIG. 8B, a lower conductive metal layer 806 can be deposited over the etch stop layer 804. The deposition of the lower metal layer 806 can be accomplished through sputtering, chemical vapor deposition, or physical vapor deposition, and so on. The lower metal layer 806 can be used to form an electrode (e.g., a reference electrode or a drive electrode) for the piezoelectric actuator.

The electrode can be formed by patterning the lower metal layer 806, for example, either by the use of a mask during the deposition, or subsequently by etching. The lower metal layer 806 has substantially uniform thickness over at least the curved portions of the etch stop layer 804 (or the curved portions of the profile-transferring layer 880 if no etch stop layer has been applied and the lower metal layer is to be used as the etch stop layer). Each of the curved portions of the lower metal layer 806 is aligned with a corresponding pumping chamber cavity 565 in the profile-transferring layer 880.

The metal used for the lower metal layer 806 can include Ir (without adhesion layer), Au, Au with a Ti/W adhesion layer, Iridium with a Ti/W adhesion layer, or Iridium without the Ti/W adhesion layer, for example. The thickness of the lower metal layer 806 can be around 2300 angstroms. The thickness of the optional adhesion layer can be around 200 angstroms. Other thicknesses for the lower metal layer 806 are possible.

Figure 8C:
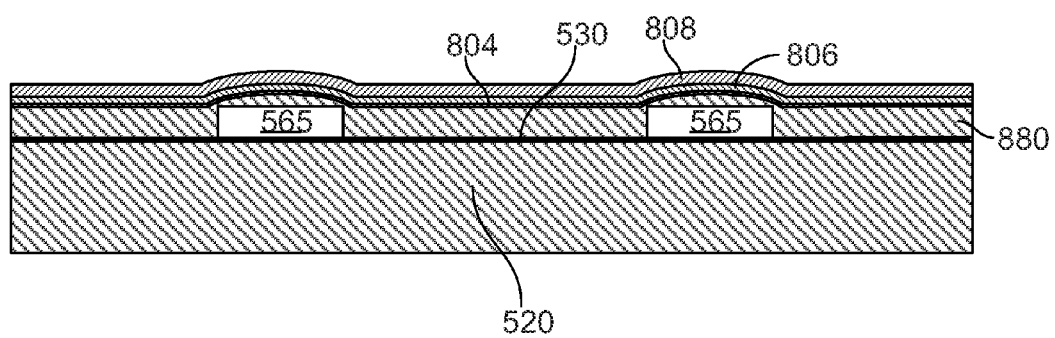

After the lower metal layer 806 has been deposited on the etch stop layer 804, a piezoelectric layer 808 can be deposited over the lower metal layer 806. Referring to FIG. 8C, the deposition of the piezoelectric layer 808 can be accomplished through sputtering, chemical vapor deposition, or physical vapor deposition, and so on. The piezoelectric layer 808 can have an as-deposited poling direction substantially perpendicular to and pointing away from the planar surface of the substrate 520.

Depending on the direction of the curvature for the curved portions in the curved piezoelectric layer 808 relative to the pumping chambers 565 and the poling direction of the piezoelectric layer, the design of the driving voltage for the piezoelectric actuators can be adjusted accordingly. As set forth in other parts of the specification, the piezoelectric layer 806 produced by the deposition methods can have internal grain structures that are columnar and aligned, and are locally perpendicular to the surface of the lower metal layer 806 or piezoelectric layer 808.

The resulting piezoelectric layer 808 has both curved portions above the pumping chambers and a planar portion surrounding the curved portions. In some implementations, the transitional region between each curved portion and the planar portion of the piezoelectric layer 808 are located beyond of the edge of the pumping chamber cavities 565 in a lateral direction, for example, by a few microns (e.g., 2-5 microns or 5-10 microns).

The thickness of the piezoelectric layer 808 can be a few microns (e.g., 3 microns). Depending on the size of the pumping chamber, and the height/depth of the curved portion in the piezoelectric layer 808, the thickness of the piezoelectric layer 808 can be tuned to have the desired stiffness and compliance for fluid ejection, and/or the desired resonance behaviors under required actuation frequencies.

Figure 8D:
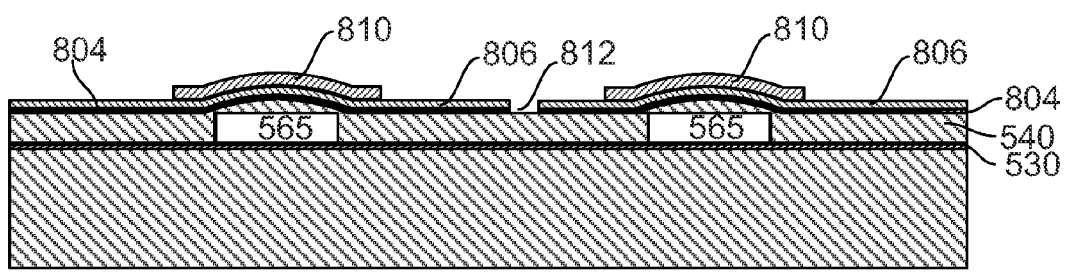

Referring to FIG. 8D, the piezoelectric layer 808 and the lower metal layer 806 can be patterned to define a separate actuator for each pumping chamber. For example, the piezoelectric layer 808, the lower metal layer 806, and the etch stop layer 804 can be segmented to isolate each fluid ejection unit from other fluid ejection units (e.g., by etching or other lithographic processes, or by sawing). The excess piezoelectric materials from around the area above each pumping chamber 565 can be removed, for example, by etching, such that only portions 810 of the piezoelectric layer 808 remain on the lower metal layer 806. The remaining portions 810 of the piezoelectric layer 808 cover areas directly above and extending slightly beyond the edges of the pumping chamber walls.

In addition, holes 812 can be formed through the lower metal layer 806 and the etch stop layer 804 to connect to the fluid inlets and outlets already formed in the pumping chamber layer 540.

Figure 8E:
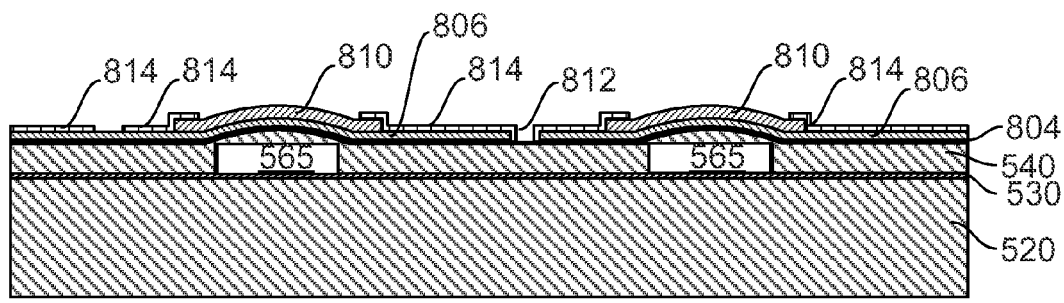

Referring to FIG. 8E, a layer of dielectric 814 can be deposited over the exposed surface of the lower metal layer 806 and the exposed surface of the piezoelectric membrane 810. The dielectric layer 814 can be used to insulate the individual actuators for different pumping chambers. The dielectric layer 814 can be patterned such that at least the curved portions of the piezoelectric membranes 810 are exposed and the individual piezoelectric actuators are insulated from one another.

Figure 8F:
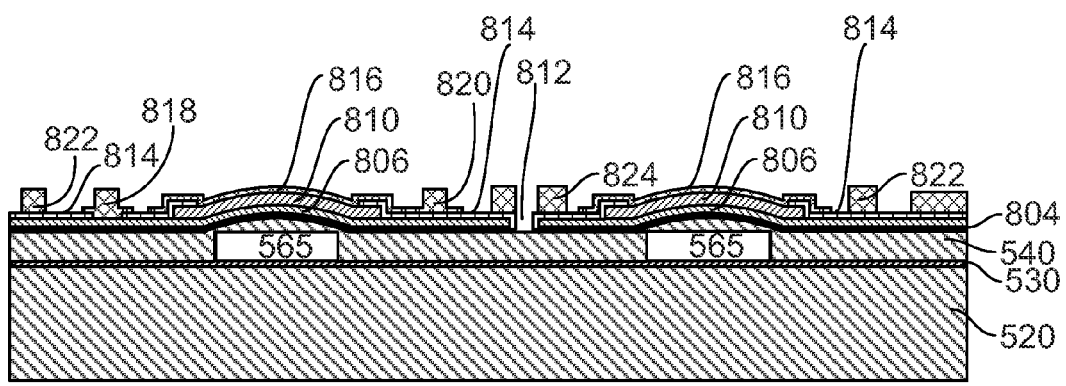

Referring to FIG. 8F, an upper metal layer 816 is deposited over the exposed surface of the dielectric layer 814 and the exposed surface of the piezoelectric membrane 810. The deposition can be accomplished, for example, by sputtering. The top metal layer 816 can be used to make the drive electrodes (or the reference electrodes if the lower metal layer 806 is used to make the drive electrodes) for the piezoelectric actuators. The top metal layer 816 can be patterned so that the top electrode for the piezoelectric actuator over each pumping chamber is separated from one another and can be controlled independently. The top metal layer 816 can also provide conductive traces to connect the individual drive electrodes to associated metal bumps.

The thickness of the top electrode layer 816 can be approximately 4000 angstroms. The top metal layer 816 can be made of Ir, Au, or Au with a Ti/W adhesion underlayer, or other suitable metals. The thickness of the metal layer may vary depending on the conductivity of the metal used. The adhesion layer can be approximately 200 angstroms. Other deposition methods can be used to deposit the upper metal layer 816, such as the Plasma-enhanced chemical vapor deposition (PECVD) or chemical vapor deposition (CVD) methods.

In some implementations, metal seeds can be deposited at various locations on the exposed surfaces of the upper metal layer 816, the lower metal layer 806, and/or the dielectric layer 814, for example, e.g., by sputtering and then etching. Then, metal bumps can be plated on the seeded metals to form various metal bumps. The metal bumps can be used as electric connections for the reference electrodes (e.g., metal bump 818) and the drive electrodes (e.g., metal bump 820). Some metal bumps (e.g., metal bump 822) can serve as spacer bumps to create room for the expansion of the actuator membrane 810 during actuation. In addition, metal seals 824 can be plated around the fluid inlet and outlet holes 812.

Figure 8G:
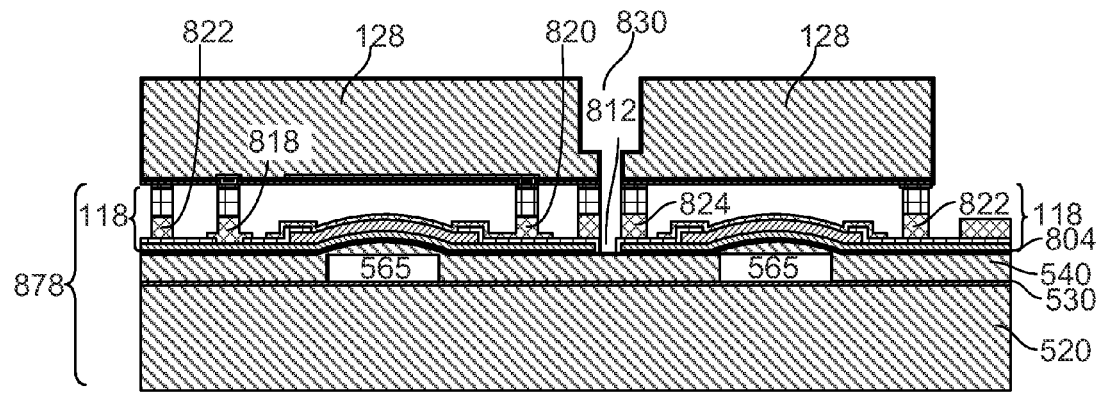

Referring to FIG. 8G, an ASIC wafer 128 can be prepared, where the ASIC wafer has corresponding electric connections for each of the electric metal bumps (e.g., metal bumps 818, and 820) formed on the piezoelectric actuator assembly 118. The ASIC wafer 128 includes at least a part of the control circuits of the piezoelectric actuators. The ASIC wafer 128 also includes a fluid channels 830 for supplying fluid to or receiving fluid from the pumping chamber 565 through the holes 812.

Figure 8H:
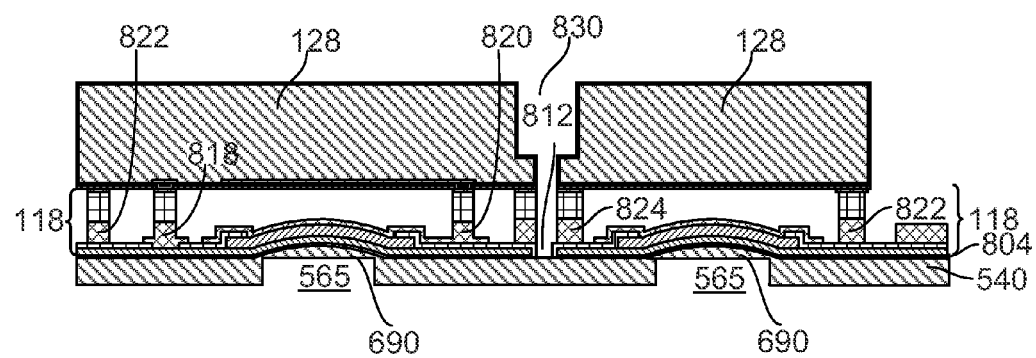

After the ASIC wafer 128 is bonded to the substrate 878 including the actuation assembly 118, the pumping chamber layer 540, and the handle layer 520, the ASIC wafer 128 can serve as a handle layer for subsequent processing from the backside of the substrate 878. First, the handle layer 520 and the oxide layer 530 can be removed by various suitable processing methods, such as grinding, polishing, and dry etching. After the oxide layer 530 has been removed completely, the inner walls of the pumping chamber cavities 565 are exposed, as shown in FIG. 8H.

Figure 8I:
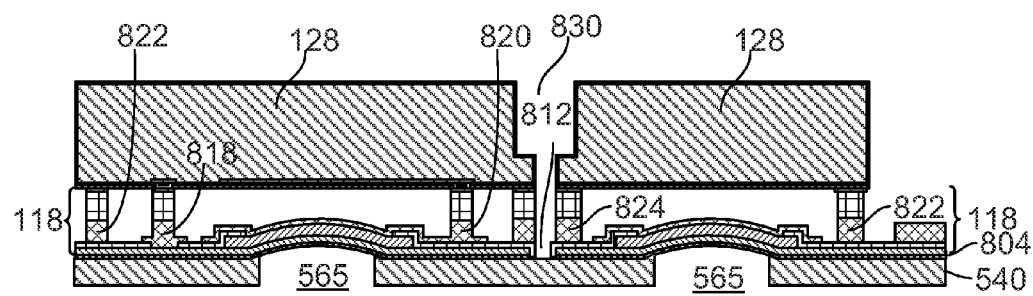

Inside each exposed pumping chamber cavity 565, part of the curved portion 690 of the profile-transferring layer 880 is also exposed. The exposed part of the curved portion 690 is etched away (e.g., by a dry etchant) until the underside of the etch stop layer 804 is exposed within the pumping chamber cavity 565. An anisotropic etchant can be used, and the pumping chamber layer 540 can serve as a mask for the etching process. When the etching is stopped by the etch stop layer 804, the resulting piezoelectric actuator structure over the pumping chamber cavity 565 has a curved surface on both the top side and the under side relative to the pumping chamber cavity, as shown in FIG. 8I.

Figure 8J:
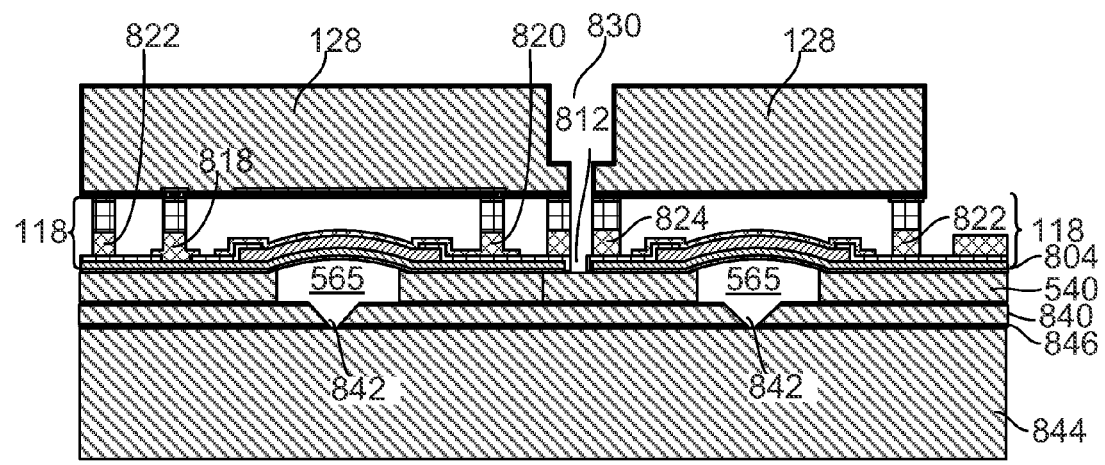

Then a nozzle layer 840 is bonded to the exposed side of the pumping chamber layer 540, such that the bottom of the pumping chamber cavity is sealed by the nozzle layer 840. In some implementations, the nozzle layer 840 can be the silicon layer of a SOI wafer, and a nozzle 842 can be formed in the nozzle layer 840 at a position aligned with a corresponding pumping chamber 565 before the nozzle layer is bonded to the pumping chamber layer 540. The nozzle 842 can be a tapered recess formed by anisotropic etching, for example. The bottom of the nozzle 843 remains sealed at this point due to the oxide layer 846 and the handle layer 844 of the SOI wafer, as shown in FIG. 8J.

Figure 8K:
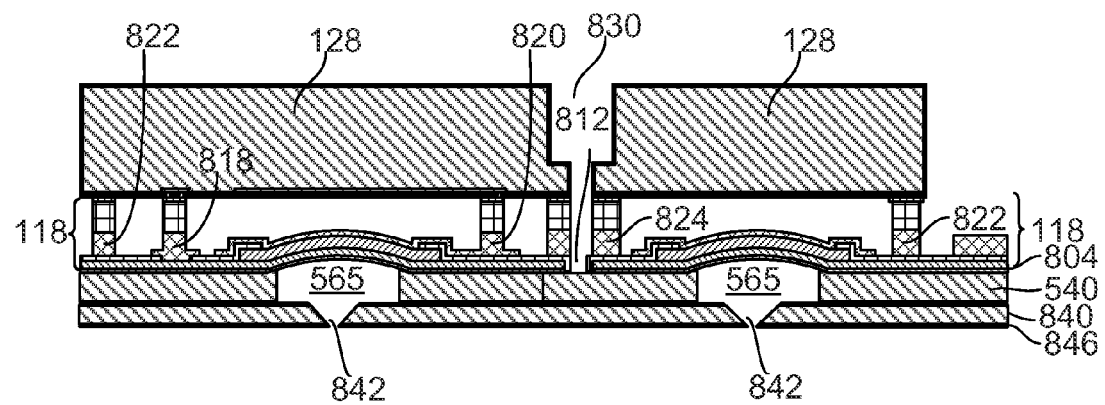

Finally, the handle layer 844 of the SOI wafer can be removed to open the nozzle 842 and form the structure shown in FIG. 1A (also shown in FIG. 8K). The same process shown in FIGS. 8A-8J can be applied to a structure formed by the process shown in FIGS. 6E-6F, and a structure shown in FIG. 1B would result.

FIGS. 9A-9K illustrate another process for forming the fluid ejection module shown in FIG. 1B. The process can start with the structure formed from the process shown in FIGS. 7A-7K. Many steps of the process shown in FIGS. 9A-9K are common to the process shown in FIGS. 8A-8K. The differences between the steps shown in FIGS. 8A-8K and the steps shown in FIGS. 9A-9K are due to the difference in the profile-transferring layers of the starting structures in the two processes. For example, in the starting structure 878 shown in FIG. 8A, the profile-transferring layer 880 includes the profile-transferring surface and the pumping chamber formed in the same semiconductor material (e.g., Si). In contrast, in the starting structure 978 shown in FIG. 9A, the profile transferring layer 980 includes a layer of polysilicon 712 that includes the curved profile-transferring surface and a pumping chamber layer 540 formed of a material other than polysilicon, such as single-crystal Si.

Except for differences explicitly stated, the description with respect to the process shown in FIGS. 8A-8K applies to the process shown in FIGS. 9A-9K. In addition, the process shown in FIGS. 8A-8K refers to a convex profile-transferring surface and forming a convex piezoelectric actuator, while the process shown in FIGS. 9A-9K refers to a concave profile-transferring surface and forming a concave piezoelectric actuator.

Figure 9A:
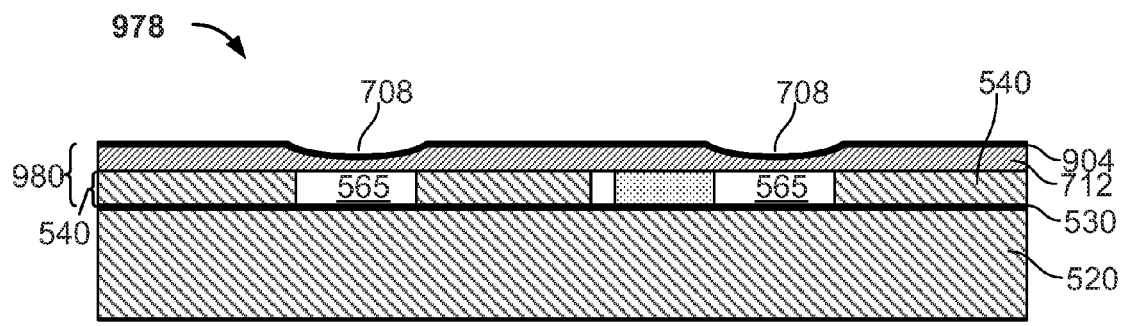
FIGS. 9A-9K illustrate an example process for forming a fluid ejection module based on another profile transferring substrate (e.g., a profile-transferring substrate having a concave surface relative to the pumping chamber).
Figure 9B:
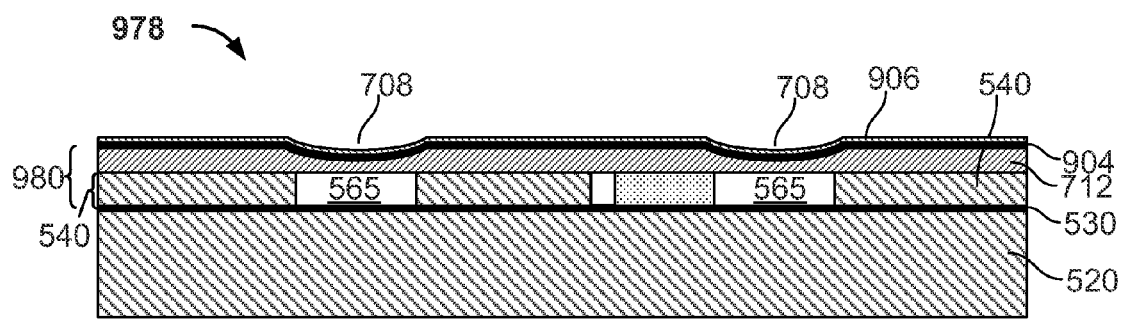
Figure 9C:
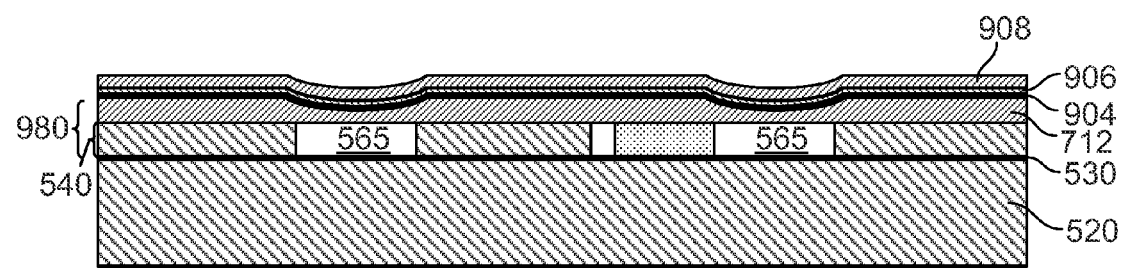
Figure 9D:
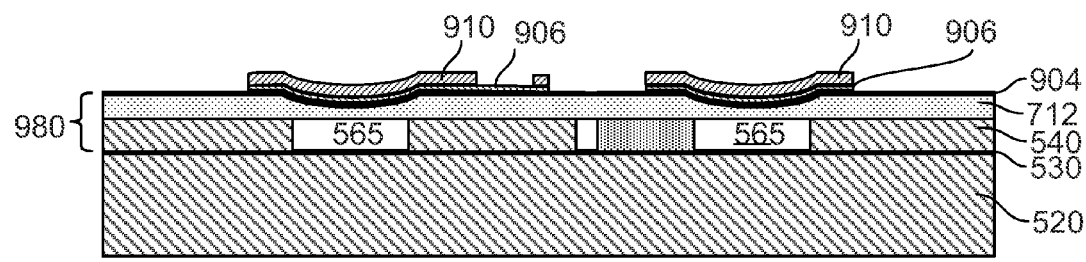

In FIG. 9A, an etch stop layer 904 is deposited over the profile-transferring surface of the polysilicon layer 712. In FIG. 9B, a conductive lower metal layer 906 is deposited over the etch stop layer 904. In FIG. 9C, a piezoelectric layer 908 is deposited on the lower metal layer 906. In FIG. 9D, the piezoelectric layer 908 and the lower metal layer 906 are patterned to the substrate into individual fluid ejection modules. Only portions 910 of the piezoelectric membrane directly above the pumping chambers remain on the lower metal layer 906. In some implementations, the remaining portions 910 of the piezoelectric membrane extend slightly beyond the edges of the pumping chambers 565.

Figure 9E:
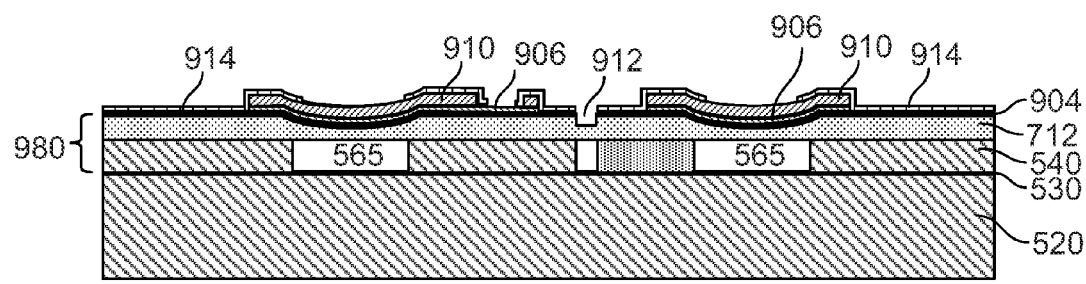

In FIG. 9E, a layer of dielectric 914 is deposited over the exposed surface of the piezoelectric layer 910 and the exposed surface of the lower metal layer 906. The dielectric layer 914 can be patterned to segment the individual fluid ejection modules. In addition, holes 912 can be formed through the dielectric layer 914, the lower metal layer 906, and the etch stop layer 904 to connect to the fluid inlets and fluid outlets (not shown) formed in the pumping chamber layer 540.

In some implementations, a portion of the polysilicon layer 712 within the holes 912 are etched down by a smaller depth such that a thin layer of polysilicon remains over the fluid inlets and outlets holes formed in the pumping chamber layer 540, as shown in FIG. 9E. The thickness of the polysilicon layer remaining in the hole 912 can be such that when the polysilicon on the backside of the oxide layer 904 is subsequently etched away inside the pumping chamber walls, the remaining layer of polysilicon inside the hole 912 can also be completely etched through.

In some implementations, in order to form the holes 912 in the polysilicon layer 712, a patterned photoresist layer is applied to exposed the surface of structure shown in FIG. 9E. After the etching of the holes is completed, the layer of photoresist needs to be removed. The removal of the photoresist can be accomplished by a wet chemical process or by a dry etch process (e.g., using a plasma etch process). If the holes are completely etched through, the removal of the photoresist layer are preferably carried out by the dry etching process rather than the wet chemical resist stripping process, so that no moisture from the web chemical process would enter and remain in the channels already formed in the pumping chamber layer 712. However, sometimes, a wet chemical resist stripping process is preferred for example, due to its simplicity or cost reasons. If a wet chemical resist stripping process is preferred, by leaving a thin membrane inside the hole 912 at this stage, the photoresist layer can be stripped without the risk of contaminating the channels inside the pumping chamber layer 712 by the wet chemicals from the photoresist stripping process.

Figure 9F:
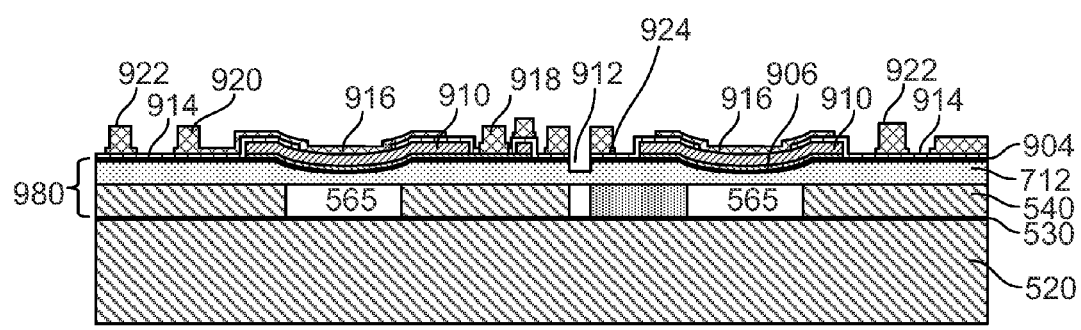

In FIG. 9F, an upper metal layer 916 is deposited over the piezoelectric layer 910, for example, by sputtering. The upper metal layer 916 can be patterned to define the drive electrodes (or the reference electrodes if the lower metal layer is used to create the drive electrodes) for individual actuators, and to expose the holes 912. In addition, electrical connection bumps (e.g., metal bumps 918 and 920) and spacer bumps (e.g., metal bump 922) can be plated on the exposed surface of the actuator structure (e.g., the lower metal layer 906, the upper metal layer 916, and the dielectric layer 914). Metal seals 924 can be plated around the holes 912 as well.

Figure 9G:
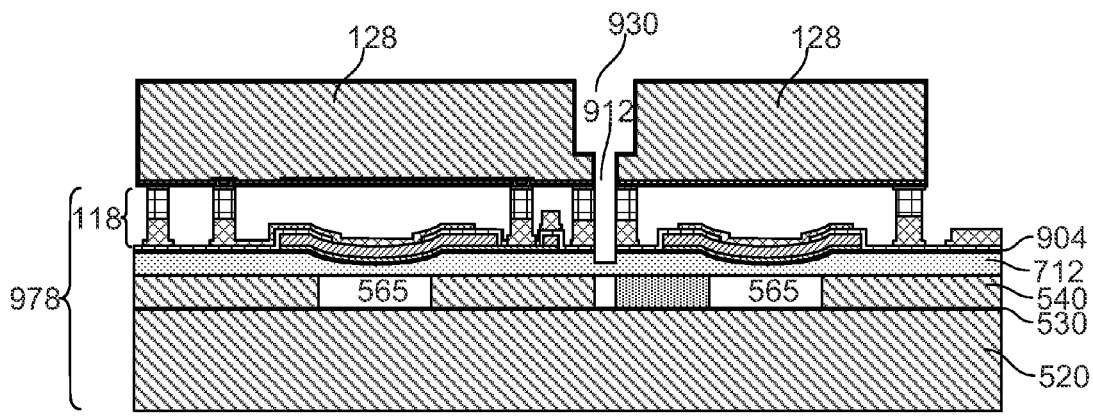
Figure 9H:
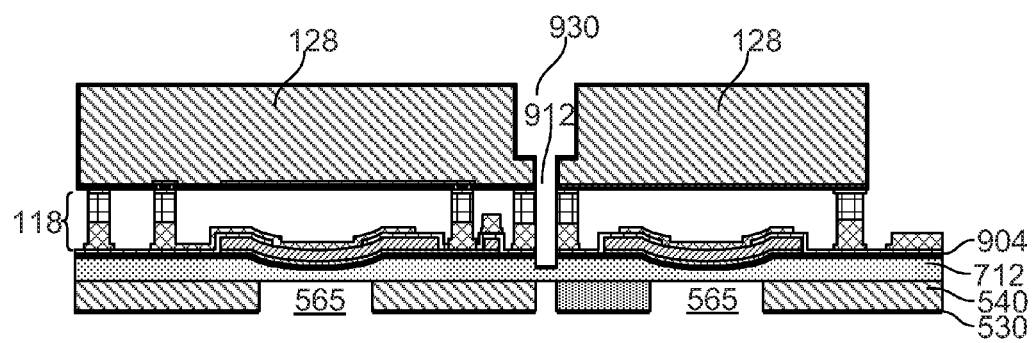

In FIG. 9G, an ASIC layer 128 is bonded to the structure 978 including the actuation layer 118 and the pumping chamber layer 540. The ASIC wafer 128 includes a fluid supply channel 930 which connects to the holes 912. Then, as shown in FIG. 9H, the handle layer 520 and the oxide layer 530 are removed to expose the inner surfaces of the pumping chamber cavities 565. In some implementations where the thickness of the oxide layer 530 is smaller inside the pumping chamber cavities 565 than outside the pumping chamber cavities 565, a thin layer of oxide (e.g., 0.25 microns) can remain on the lower surface of the pumping chamber layer 540 when the pumping chamber cavities 565 are etched open.

Figure 9I:
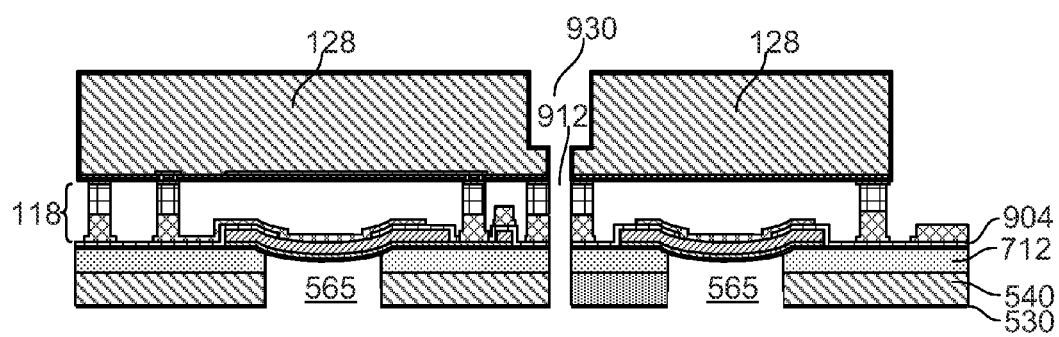

In FIG. 9I, the portions of polysilicon layer 712 within the pumping chamber cavities 565 are removed from the side adjacent to the pumping chamber 565, for example, by etching. The pumping chamber layer 540 can serve as the mask for the etching. An anisotropic etchant can be used, such that only the portions of the polysilicon layer 712 within the pumping chamber cavities 565 are etched away.

In addition, as the portions of polysilicon layer 712 within the pumping chamber cavities 565 are removed from the backside of the oxide layer 904, the thin layer of polysilicon remaining inside the hole 912 is also removed by the etching process.

Figure 9J:
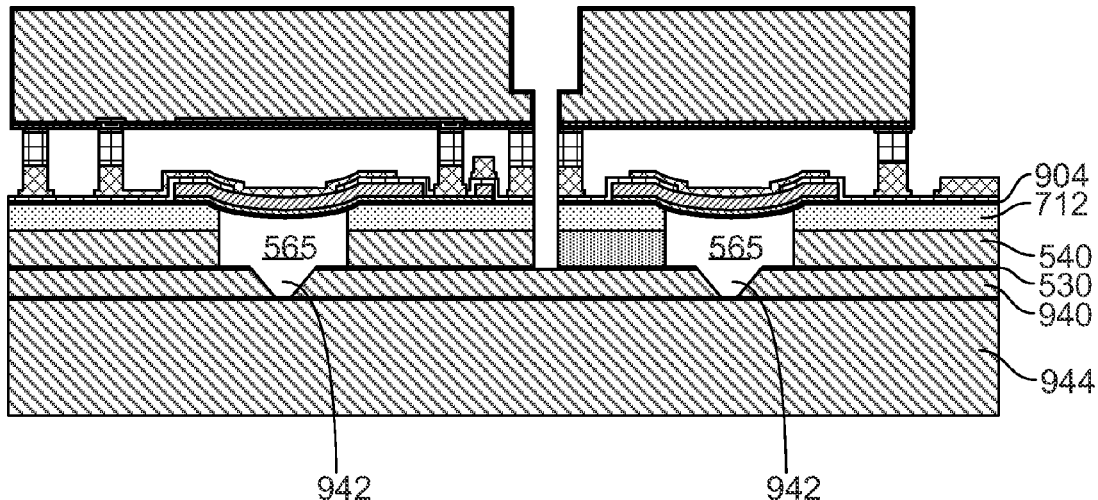

In FIG. 9J, a substrate containing a nozzle layer 940 is bonded to the pumping chamber layer 540, for example, by adhesion. The nozzle layer 940 includes nozzles 942. The remaining thin layer of oxide 530 can help facilitate the bonding between the pumping chamber layer 540 and the nozzle layer 940. The substrate can also include a handle layer 944 which blocks the nozzle openings.

Figure 9K:
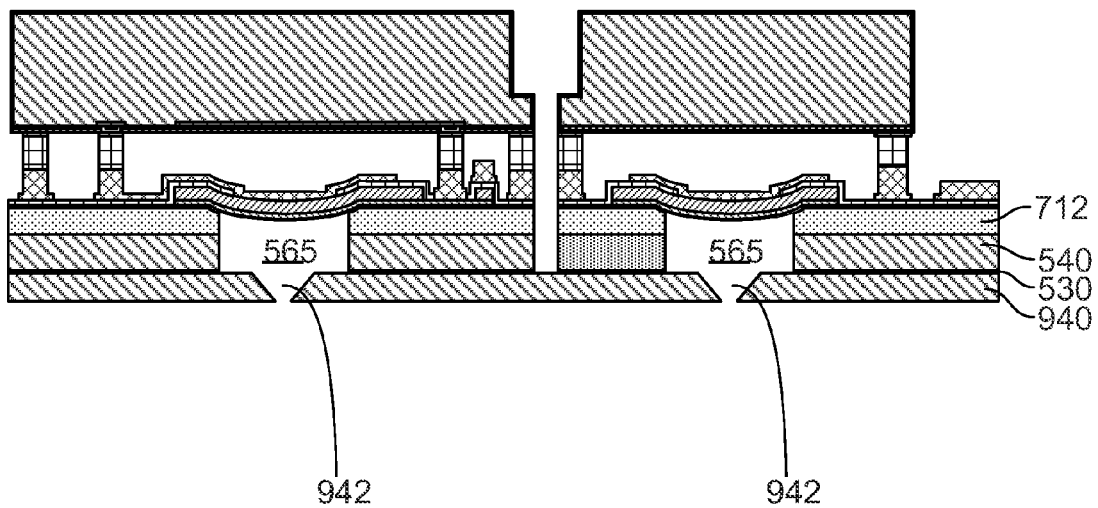

In FIG. 9K, the handle layer 944 is removed, and the nozzles 942 are opened. The printhead module 100*b* shown in FIG. 1B (also shown in FIG. 9K) can be produced.

Other methods that use a profile-transferring surface to form a curved piezoelectric membrane are possible.

Figure 10A:
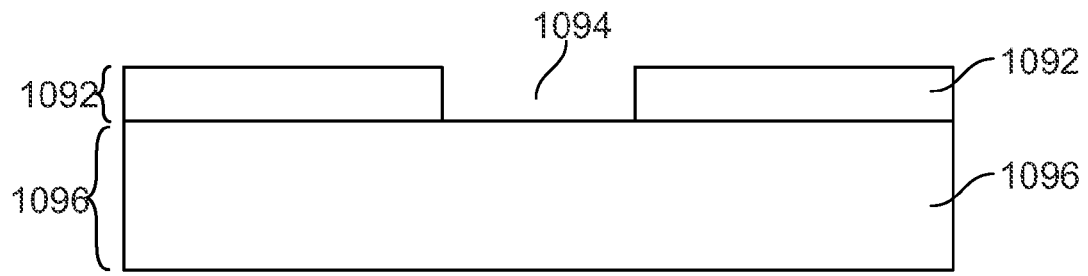
FIGS. 10A-10G illustrate an example process for forming a printhead die in a fluid ejection module based on another profile-transferring substrate.

For example, referring to FIG. 10A, a layer of photoresist 1092 can be deposited on an exposed planar surface of a semiconductor substrate 1096. The photoresist layer 1092 can be patterned such that an opening 1094 is formed in the photoresist layer 1092. The shape of the opening resembles the lateral cross-section of the pumping chamber. The size of the opening can be slightly larger than the lateral dimensions of the pumping chamber, for example by a few microns (e.g., 2-5 microns, or 5-10 microns).

Figure 10B:
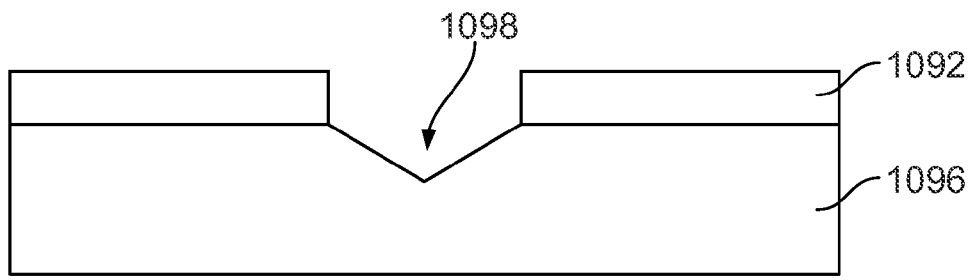
Figure 10C:
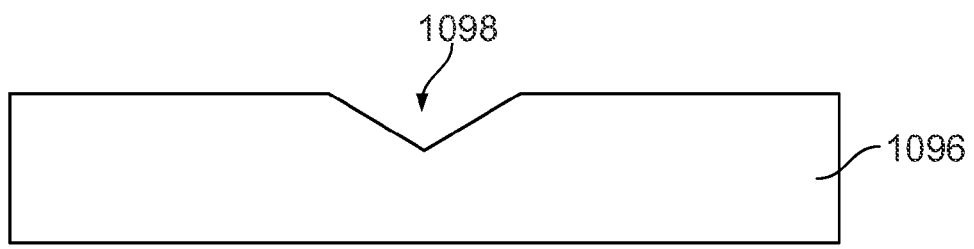

Referring to FIG. 10B, the photoresist layer 1092 and the exposed substrate surface can be exposed to an anisotropic etchant such as KOH, such that a recess 1098 is formed in the surface of the substrate 1096. The etchant can be prepared such that the resulting recess 1098 has tapered side walls. Once the recess 1098 is formed, the etching can be stopped and the photoresist layer 1092 can be stripped away. The resulting structure is shown in FIG. 10C.

Figure 10D:
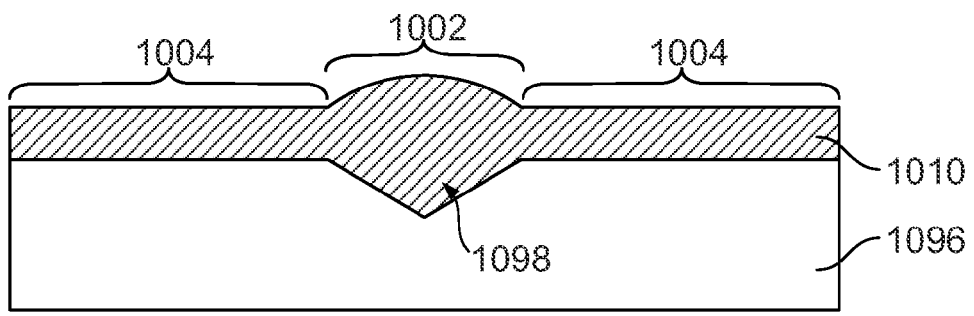

Referring to FIG. 10D, a metal or another material having a suitable melting point can be sputtered into the recess 1098 to form a metal layer 1010. The metal layer 1010 has a domed surface 1002 over the recess 1098 and a substantially planar portion 1004 around the domed portion 1002.

Figure 10E:
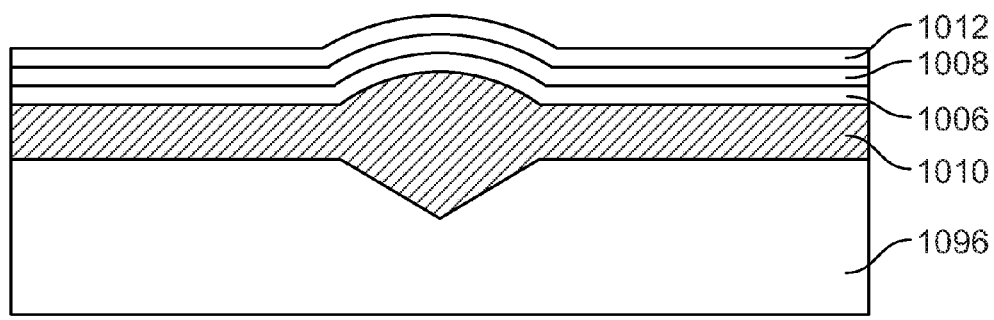

Once the substrate having the curved surface portion 1002 has been formed, the curved surface 1002 can serve as the profile-transferring surface on which the piezoelectric structure having a curved piezoelectric membrane can be formed. In some implementations, as shown in FIG. 10E, a lower metal layer 1006, a piezoelectric layer 1008, and a top metal layer 1012 are deposited in sequence on the curved portion 1002 surrounded by the planar portion 1004, for example, in a manner similar as that described with respect to FIGS. 8A-8E. In some implementations, only the lower metal layer and the piezoelectric layer are deposited.

Figure 10F:
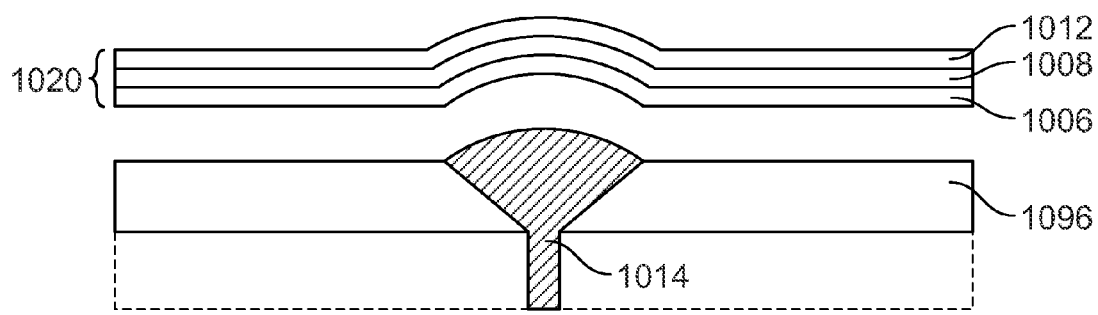

Subsequently, as shown in FIG. 10F, the tapered recess 1098 can be opened from below, for example, by grinding, polishing, and/or etching from the lower side of the substrate. The substrate can be heated until the metal melts and flows out of the opened recess 1098 (e.g., through the opening 1014). As the material 1010 flows out of the opening 1014, the structure 1020 formed by the lower metal layer 1006, the piezoelectric layer 1008 and the top metal layer 1012 can be lifted off the substrate 1096.

Figure 10G:
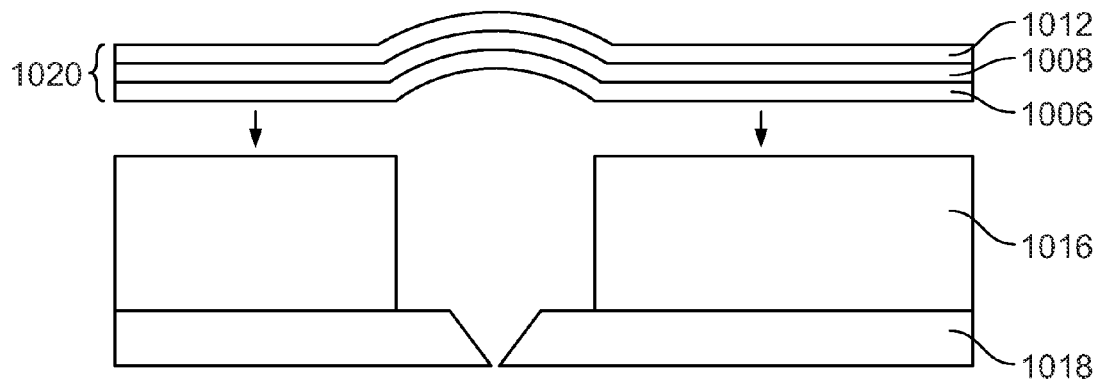

Referring to FIG. 10G, the structure 1020 having the curved piezoelectric layer 1008 can be bonded to a pumping chamber layer 1016, where the pumping chamber is further bonded to a nozzle layer 1018 to form a flow path body. Other parts of a fluid ejection module can be created and/or added to the structure resulting from the step shown in FIG. 10G in a manner similar to the process described with respect to FIGS. 8F-8G, for example.

What is claimed is:

1. A method of fabricating a MEMS actuator, comprising:
   forming a curved surface in a first side of a profile-transferring substrate, the first side of the profile-transferring substrate including a planar surface surrounding the curved surface;
   forming a recess in a second side of the profile-transferring substrate opposite the first side, wherein the recess and the curved surface are aligned;
   depositing an etch stop layer on the first side of the profile-transferring substrate, the etch stop layer covering at least the curved surface of the profile-transferring substrate;
   depositing a piezoelectric layer on the etch stop layer, the piezoelectric layer covering at least the curved surface of the profile-transferring substrate; and
   from the second side of the profile-transferring substrate, etching the profile-transferring substrate in the recess to expose the etch stop layer.

2. The method of claim 1, wherein the curved surface in the first side of the profile-transferring substrate is concave relative to the planar surface in the first side of the profile-transferring substrate.

3. The method of claim 1, wherein the curved surface in the first side of the profile-transferring substrate is convex relative to the planar surface in the first side of the profile-transferring substrate.

4. The method of claim 1, wherein forming the curved surface in the first side of the profile-transferring substrate further comprises:
   depositing a photoresist layer on the first side of the profile-transferring substrate, the first side of the profile-transferring substrate being substantially planar before the photoresist layer is deposited;
   forming a curved surface in a first side of the photoresist layer, the first side of the photoresist layer including a planar surface surrounding the curved surface in the first side of the photoresist layer, and the curved surface in the first side of the photoresist layer aligned with the recess; and
   etching the photoresist layer and the profile-transferring substrate from the first side of the photoresist layer to transfer a profile of the photoresist layer to the first side of the profile-transferring substrate.

5. The method of claim 4, wherein forming the curved surface in the first side of the photoresist layer further comprises:
   exposing the first side of the photoresist layer to UV light through a grayscale photomask for a predetermined duration, wherein the grayscale photomask exposes the photoresist layer to a decreasing amount of UV light with increasing radial distance from the center of the recess; and
   developing the photoresist layer after the UV light exposure.

6. The method of claim 4, wherein etching the photoresist layer and the substrate layer from the first side of the photoresist layer to transfer the profile of the photoresist layer to the first side of the profile-transferring substrate further comprises:
   etching the first side of the photoresist layer and the first side of the profile-transferring substrate with a selected anisotropic etchant, wherein the selected anisotropic etchant has approximately equal selectivity for materials of the photoresist layer and the profile-transferring substrate; and stopping the etching when the photoresist layer has been completely removed.

7. The method of claim 1, wherein forming the curved surface in the first side of the profile-transferring substrate further comprises:

depositing a photoresist layer on the first side of the profile-transferring substrate, the first side of the profile-transferring substrate being substantially planar before the photoresist layer is deposited;

forming a curved surface in a first side of the photoresist layer, the curved surface in the first side of the photoresist layer aligned with the recess; and etching the photoresist layer and the profile-transferring substrate from the first side of the photoresist layer to transfer a profile of the photoresist layer to the first side of the profile-transferring substrate.

8. The method of claim 7, wherein forming the curved surface in first side of the photoresist layer further comprises:

patterning the photoresist layer such that only a portion of the photoresist layer above the recess remains on the first side of the profile-transferring substrate;

heating the photoresist layer remaining on the first side of the profile-transferring substrate such that the photoresist layer reflows to form a photoresist dome on the first side of profile-transferring substrate; and cooling the photoresist layer such that the photoresist dome solidifies on the first side of the profile-transferring substrate.

9. The method of claim 7, wherein etching the photoresist layer and the substrate layer from the first side of the photoresist layer to transfer the profile of the photoresist layer to the first side of the profile-transferring substrate further comprises:

etching the first side of the photoresist layer and the first side of the profile-transferring substrate with a selected anisotropic etchant, wherein the selected anisotropic etchant has approximately equal selectivity for materials of the photoresist layer and the profile-transferring substrate; and stopping the etching when the photoresist layer has been completely removed.

10. The method of claim 1, wherein forming the curved surface in the first side of the profile-transferring substrate further comprises:

forming a negative profile-transferring substrate, the negative profile-transferring substrate having a curved surface in a first side of the negative profile-transferring substrate, and the curved surface in the first side of the negative profile-transferring substrate being surrounded by a planar surface in the first side of the negative profile-transferring substrate;

depositing a first semiconductor layer on the first side of the negative profile-transferring substrate such that a first side of the semiconductor layer conforms to the curved surface and the planar surface of the first side of the negative profile-transferring substrate; and removing the negative profile-transferring substrate from the first side of the negative profile-transferring substrate until the first side of the first semiconductor layer is exposed, the exposed first side of the first semiconductor layer including the curved surface and the planar surface of the profile-transferring substrate.

11. The method of claim 10, further comprising:

prior to removing the negative profile-transferring substrate, planarizing a second side of the first semiconductor layer opposite to the first side of the first semiconductor layer; and bonding the second side of the first semiconductor layer to a first side of a second semiconductor layer, the second semiconductor layer and the first semiconductor layer forming at least part of the profile-transforming substrate that contains the recess.

12. The method of claim 10, wherein forming a negative profile-transferring substrate further comprises:

depositing a photoresist layer on the first side of the negative profile-transferring substrate, the first side of the negative profile-transferring substrate being substantially planar before the photoresist layer is deposited;

forming a curved surface in a first side of the photoresist layer;

etching the photoresist layer and the negative profile-transferring substrate from the first side of the photoresist layer to transfer a profile of the photoresist layer to the first side of the negative profile-transferring substrate; and forming a layer of oxide over at least the first side of the negative profile-transferring substrate.

13. The method of claim 10, wherein the first semiconductor layer is made of polysilicon.

14. The method of claim 1, wherein the profile-transferring substrate include a profile transferring layer and a pumping chamber layer, the profile transferring layer includes the curved surface in the first side of the profile-transferring substrate, and the pumping chamber layer includes the recess, and wherein forming the recess in the second side of the profile-transferring substrate opposite the first side further comprises:

forming the recess in the pumping chamber layer; and bonding pumping chamber layer to the profile transferring layer.

15. The method of claim 1, wherein depositing the etch stop layer on the first side of the profile-transferring substrate comprises:

oxidizing the first side of the profile-transferring substrate.

16. The method of claim 1, wherein depositing the etch stop layer on the first side of the profile-transferring substrate comprises:

depositing a metal layer on the first side of the profile-transferring substrate.

17. The method of claim 1, wherein depositing the piezoelectric layer on the etch stop layer further comprises:

sputtering a piezoelectric material on a first side of the etch stop layer, the sputtered piezoelectric material covering at least the curved surface of the profile-transferring substrate.

18. The method of claim 1, wherein depositing the piezoelectric layer on the etch stop layer further comprises:

forming a uniform layer of piezoelectric material on a first side of the etch stop layer; and patterning the uniform layer of piezoelectric material to form a piezoelectric membrane that includes a curved portion covering the curved surface of the profile-transferring substrate and a planar portion that extends beyond the curved surface of the profile-transferring substrate.

19. The method of claim 1, further comprising:

prior to depositing the piezoelectric layer on the etch stop layer, depositing a lower metal layer on the etch stop layer; and after depositing the piezoelectric layer on the etch stop layer, depositing an upper metal layer on the piezoelectric layer.

20. The method of claim 1, further comprising:

attaching a nozzle layer to the second side of the profile-transferring substrate, the nozzle layer includes a nozzle feature and the nozzle feature and the recess are aligned.

* * * * *

UNITED STATES PATENT AND TRADEMARK OFFICE
CERTIFICATE OF CORRECTION

| | | |
|---|---|---|
| PATENT NO. | : 8,969,105 B2 | Page 1 of 1 |
| APPLICATION NO. | : 13/810696 | |
| DATED | : March 3, 2015 | |
| INVENTOR(S) | : Paul A. Hoisington et al. | |

It is certified that error appears in the above-identified patent and that said Letters Patent is hereby corrected as shown below:

In the Claims

Col. 34, Line 13, Claim 12, delete "forming a" and insert -- forming the --, therefor.

Signed and Sealed this
Twenty-second Day of December, 2015

Michelle K. Lee
*Director of the United States Patent and Trademark Office*